(12) United States Patent
Lee et al.

(10) Patent No.: US 9,146,579 B2
(45) Date of Patent: *Sep. 29, 2015

(54) EMBEDDED MULTIMEDIA CARD (EMMC), HOST FOR CONTROLLING EMMC METHOD OPERATING EMMC SYSTEM

(71) Applicant: SAMSUNG ELECTRONICS CO., LTD., Suwon-Si, Gyeonggi-Do (KR)

(72) Inventors: Jung Pil Lee, Hwaseong-Si (KR); Young Gyu Kang, Yongin-Si (KR); Sung Ho Seo, Seoul (KR); Myung Sub Shin, Suwon-Si (KR); Kyung Phil Yoo, Seoul (KR); Kyoung Lae Cho, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 65 days.

This patent is subject to a terminal disclaimer.

(21) Appl. No.: 14/025,886

(22) Filed: Sep. 13, 2013

(65) Prior Publication Data

US 2014/0082402 A1 Mar. 20, 2014

(30) Foreign Application Priority Data

Sep. 14, 2012 (KR) .................. 10-2012-0102468

(51) Int. Cl.
*G11C 8/00* (2006.01)
*G06F 1/08* (2006.01)
*G06F 1/04* (2006.01)
*G06F 1/06* (2006.01)

(52) U.S. Cl.
CPC .. *G06F 1/08* (2013.01); *G06F 1/04* (2013.01); *G06F 1/06* (2013.01)

(58) Field of Classification Search
CPC .............. G06F 1/08; G06F 1/06; G11C 7/222
USPC .................. 365/233.1, 189.011, 233.11
See application file for complete search history.

(56) References Cited

U.S. PATENT DOCUMENTS

| | | | |
|---|---|---|---|
| 6,708,263 B2 | 3/2004 | Fujii | |
| 7,370,168 B2 | 5/2008 | Kanamori et al. | |
| 7,525,855 B2 | 4/2009 | Kagan | |
| 8,307,151 B1 * | 11/2012 | Caraccio et al. | 711/103 |
| 2005/0045722 A1 | 3/2005 | Park | |
| 2005/0097291 A1 | 5/2005 | Han | |
| 2008/0132091 A1 | 6/2008 | Choi | |
| 2011/0110165 A1 * | 5/2011 | Gillingham et al. | 365/189.05 |

FOREIGN PATENT DOCUMENTS

| | | |
|---|---|---|
| JP | 2007072922 | 3/2007 |
| JP | 2007219875 | 8/2007 |
| KR | 0878125 B1 | 1/2009 |

* cited by examiner

*Primary Examiner* — Fernando Hidalgo
(74) *Attorney, Agent, or Firm* — Volentine & Whitt, PLLC

(57) ABSTRACT

An embedded multimedia card (eMMC) includes a clock channel receiving a clock from a host, a complementary clock channel receiving a complementary clock from the host, a command/response channel exchanging commands/responses with the host, a plurality of data channels exchanging data between the host and the eMMC, a return clock channel sending a return clock to the host synchronously with data, a complementary return clock channel sending a complementary return clock to the host, and a reference voltage channel that either receives a reference voltage from the host or communicates a reference voltage to the host.

18 Claims, 19 Drawing Sheets

FIG. 6

| Bit | Device Type |
|---|---|
| 7 | DDR400 Dual Data Rate e·MMC @ 200 MHz – 1.2V I/O |
| 6 | DDR400 Dual Data Rate e·MMC @ 200 MHz – 1.8V I/O |
| 5 | HS200 Single Data Rate e·MMC @ 200 MHz – 1.2V I/O |
| 4 | HS200 Single Data Rate e·MMC @ 200 MHz – 1.8V I/O |
| 3 | High-Speed Dual Data Rate e·MMC @ 52 MHz – 1.2V I/O |
| 2 | High-Speed Dual Data Rate e·MMC @ 52 MHz – 1.8V or 3V I/O |
| 1 | High-Speed e·MMC @ 52 MHz – at rated device voltage(s) |
| 0 | High-Speed e·MMC @ 26 MHz – at rated device voltage(s) |

FIG. 7A

HS_TIMING(timing and driver strength)

| Bit 7 | Bit 6 | Bit 5 | Bit 4 | Bit 3 | Bit 2 | Bit 1 | Bit 0 |
|---|---|---|---|---|---|---|---|
| Selected Driver Strength | | | | Timing Interface | | | |

FIG. 7B

HS_TIMING values

| Value | Timing Interface | Remarks |
|---|---|---|
| 0x0 | Selecting backwards compatibility interface timing | |
| 0x1 | High Speed | |
| 0x2 | HS200 | |
| 0x3 | DDR400 | |

Note1: $t_{ISU}$ and $t_{IH}$ are measured at $V_{IL}$(max.) and $V_{IH}$(min.).
Note2: $V_{IH}$ denote $V_{IH}$(min.) and $V_{IL}$ denotes $V_{IL}$(max.).

FIG. 9

| Parameter | | Symbol | Min | Max. | Unit | Remark |
|---|---|---|---|---|---|---|
| Input CLK | | | | | | |
| Cycle time data transfer mode | | tPERIOD | 5 | – | ns | 200MHz(Max.), between rising edges |
| Clock high time | | tWH | 1.5 | | ns | $C_{BGA} \leq 6pF$ |
| Clock low time | | tWL | 1.5 | | ns | $C_{BGA} \leq 6pF$ |
| Clock rising/falling time | | tTLH, tTHL | – | 0.2·tPERIOD | ns | tTLH, tTHL<1ns(max.) at 200MHz, $C_{BGA}$=6pF, The absolute maximum value of tTLH, tTHL is 10ns regardless of clock frequency. |
| Clock duty cycle | | | 47.5 | 52.5 | % | Includes jitter, phase noise |
| Input DAT (referenced to CLK) | | | | | | |
| 333MHz | Input set-up time | tISUddr | 0.5 | | ns | $4pF \leq C_{BGA} \leq 6pF$ |
| | Input hold time | tIHddr | 0.5 | | ns | $4pF \leq C_{BGA} \leq 6pF$ |
| 400MHz | Input set-up time | tISUddr | 0.4 | | ns | $4pF \leq C_{BGA} \leq 6pF$ |
| | Input hold time | tIHddr | 0.4 | | ns | $4pF \leq C_{BGA} \leq 6pF$ |

Note: V_OH denotes V_OH (min.) and V_OL denotes V_OL (max.).

FIG. 11

| Parameter | | Symbol | Min | Max. | Unit | Remark |
|---|---|---|---|---|---|---|
| Output CLK | | | | | | |
| Cycle time data transfer mode | | tPERIOD | 5 | – | ns | 200MHz(Max.), between rising edges |
| RCLK high time | | tRWH | 1.5 | | ns | $C_{BGA} \leq 6pF$ |
| RCLK low time | | tRWL | 1.5 | | ns | $C_{BGA} \leq 6pF$ |
| Clock rising/falling time | | tTLH, tTHL | – | 0.2·tPERIOD | ns | tTLH, tTHL<1ns(max.)at 200MHz, $C_{BGA}$=6pF, The absolute maximum value of tTLH, tTHL is 10ns regardless of clock frequency. |
| Clock duty cycle | | | 45 | 55 | % | Includes jitter, phase noise |
| Output DAT (referenced to RCLK) | | | | | | |
| 333MHz | Output hold skew | tRQ | 0.5 | | ns | $4pF \leq C_{BGA} \leq 6pF$ |
| | Output hold time | tRQH | 0.5 | | ns | $4pF \leq C_{BGA} \leq 6pF$ |
| 400MHz | Output hold skew | tRQ | 0.4 | | ns | $4pF \leq C_{BGA} \leq 6pF$ |
| | Output hold time | tRQH | 0.4 | | ns | $4pF \leq C_{BGA} \leq 6pF$ |

FIG. 12

| Type | DDR Max Freq | Remark |
|---|---|---|
| 0 | 52MHz | Support up to 52MHz operation |
| 1 | 100MHz | Support up to 100MHz operation |
| 2 | 133MHz | Support up to 133MHz operation |
| 3 | 166MHz | Support up to 166MHz operation |
| 4 | 200MHz | Support up to 200MHz operation |

FIG. 13

| Bit 7 | Bit 6 | Bit 5 | Bit 4 | Bit 3 | Bit 2 | Bit 1 | Bit 0 |
|---|---|---|---|---|---|---|---|
| Reserved | VREF Set | nRCLK Set | nCLK Set | Reserved | VREF Support | nRCLK Support | nCLK Support |

FIG. 14

| Name | Type1 | Description |
|---|---|---|
| CLK | I | Clock |
| CLK_n | I | CLK Complement (Host Connection Optional)<br>CLK_n is paired with CLK to provide differential signaling |
| RCLK | O | Data Strobe Clock<br>Output with data read (edge aligned) |
| RCLK_n* | O | RCLK Complement (Host Connection Optional)<br>RCLK_n is paired with RCLK to provide differential signaling |
| DAT0 | I/O/PP | Data |
| DAT1 | I/O/PP | Data |
| DAT2 | I/O/PP | Data |
| DAT3 | I/O/PP | Data |
| DAT4 | I/O/PP | Data |
| DAT5 | I/O/PP | Data |
| DAT6 | I/O/PP | Data |
| DAT7 | I/O/PP | Data |
| CMD | I/O/PP/OD | Command/Response |
| RST_n | I | Hardware reset |
| VCC | S | Supply voltage for Core |
| VCCQ | S | Supply voltage for I/O |
| VSS | S | Supply voltage ground for Core |
| VSSQ | S | Supply voltage ground for I/O |
| VREF* | S | Voltage Refense (Host Connection Optional)<br>The Voltage Reference is optional for the host to provide |

NOTE :
I : input; O: output; PP: push-pull; OD: open-drain; NC: Not connected (or logical high); S: power supply
*: If not used, the host shall not connect optional pin

EMBEDDED MULTIMEDIA CARD (EMMC), HOST FOR CONTROLLING EMMC METHOD OPERATING EMMC SYSTEM

CROSS-REFERENCE TO RELATED APPLICATIONS

This application claims priority under 35 U.S.C. §119(a) from Korean Patent Application No. 10-2012-0102468 filed Sep. 14, 2012, the subject matter of which is hereby incorporated by reference.

BACKGROUND

The inventive concept relates to embedded multimedia card(s) (eMMC), and more particularly, to eMMC having structures and functionality that support a 200 MHz dual data rate (DDR) mode of operation. The inventive concept also relates to hosts controlling this type of eMMC, as well as eMMC systems.

The so-called multimedia card (MMC) is a flash memory card standard. The eMMC is an embedded MMC standard defined by the Joint Electron Devices Engineering Council (JEDEC). In general configuration and application eMMCs are designed to be inserted (or "embedded") in conjunction with a host within mobile communication devices such as smart phones. Conventionally, the eMMC communicates data signals, control signals, commands, clock(s) and/or power signals with the connected host in accordance with a standardize ten (10) signal line bus.

SUMMARY

According to certain embodiments of the inventive concept, there is provided an embedded multimedia card (eMMC) including; a clock channel that receives a clock from a host, a complementary clock channel that receives a complementary clock from the host, a command/response channel that receives a command from the host and communicates a response to the host, a plurality of data channels that receives data from the host and communicates data to the host, a return clock channel that communicates a return clock to the host synchronously with communication of the data to the host, a complementary return clock channel that communicates a complementary return clock to the host, and a reference voltage channel that either receives a reference voltage from the host, or communicates a reference voltage to the host.

According to certain embodiments of the inventive concept, there is provided a host that controls an embedded multimedia card (eMMC) in an eMMC system, the host including; a clock channel that communicates a clock to the eMMC, a complementary clock channel that communicates a complementary clock to the eMMC, a command/response channel that communicates a command to the eMMC and receives a response from the eMMC, a plurality of data channels that communicate data to the eMMC and receive data from the eMMC, a return clock channel that receive a return clock synchronous with the data received from the eMMC, a complementary return clock channel that receives a complementary return clock from the eMMC, and a reference voltage channel that either communicates a reference voltage to the eMMC or receives the reference voltage from the eMMC.

According to certain embodiments of the inventive concept, there is provided a method of operating an embedded multimedia card (eMMC) system including a host and an eMMC, the method including; during a read operation performed by the eMMC system, communicating a clock from the host to the eMMC, generating a return clock and a complementary return clock from the clock in the eMMC, and communicating at least one of the return clock and the complementary return clock to the host from the eMMC synchronously with read data communicated to the host from the eMMC.

BRIEF DESCRIPTION OF THE DRAWINGS

Certain embodiments of the inventive concept will be described with reference to the accompanying drawings in which:

FIG. 6 is a table listing possible definitions for a device type field according to embodiments of the inventive concept;

FIG. 7, inclusive of FIGS. 7A and 7B, illustrates HS_TIMING and HS_TIMING values for certain embodiments of the inventive concept;

FIG. 9 is a table listing parameters related to the timing diagram of FIG. 8;

FIG. 11 is a table listing parameters related to the timing diagram of FIG. 10;

FIG. 12 is a table diagram of information that is about the maximum frequency of a clock in a DDR400 mode, which is stored in a VENDOR_SPECIFIC_FIELD of an extended card specific data (CSD) register, according to some embodiments of the inventive concept;

FIG. 13 is a diagram of the definition of an extra input/output (IO) field in the DDR400 mode, which is stored in a VENDOR_SPECIFIC_FIELD of an extended CSD register, according to some embodiments of the inventive concept;

FIG. 14 is a diagram of the signals of eMMC interface according to some embodiments of the inventive concept;

DETAILED DESCRIPTION

Figure 1:
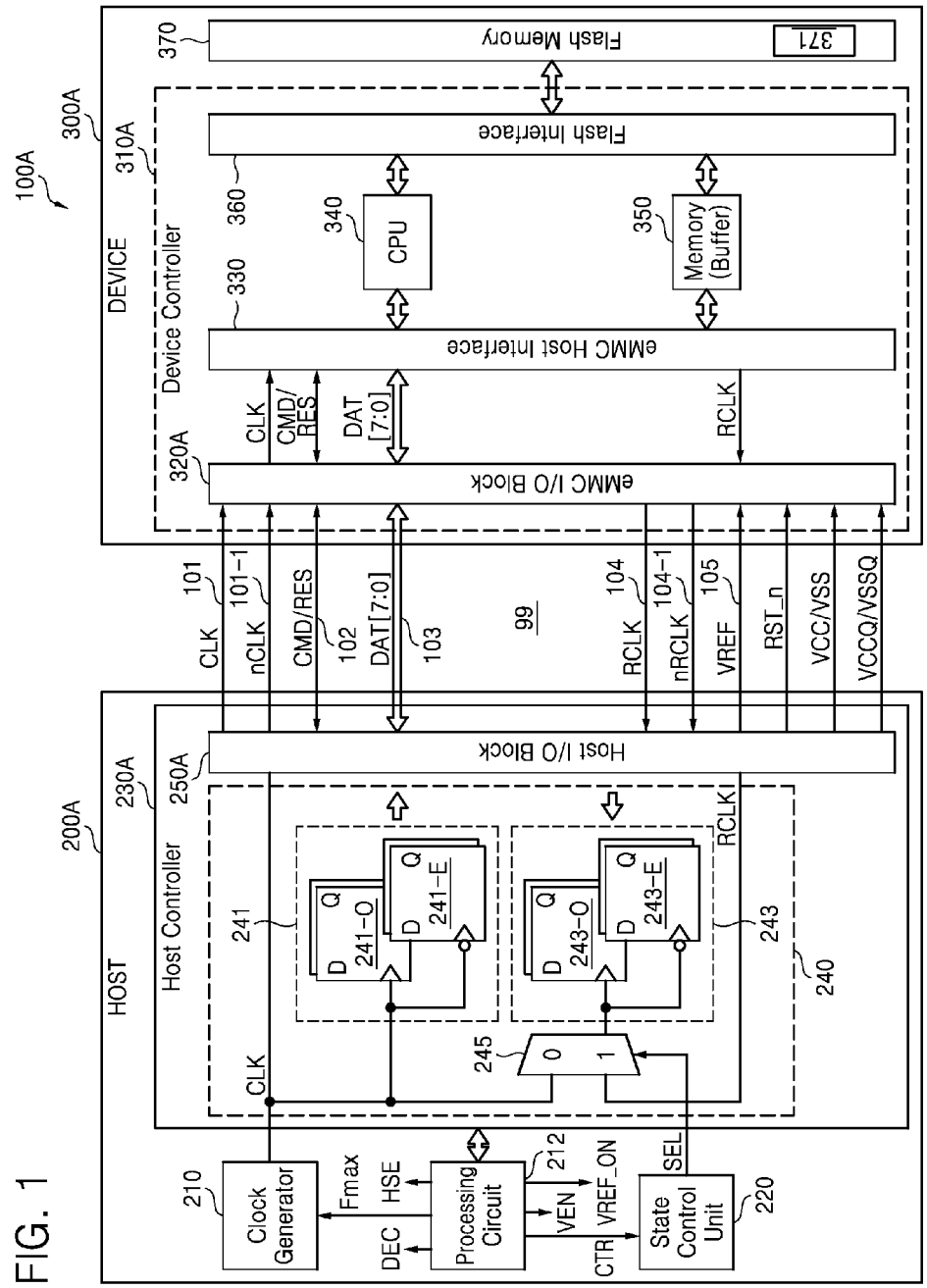
FIG. 1 is a block diagram of an embedded multimedia card (eMMC) system according to embodiments of the inventive concept.

Certain embodiments the inventive concept will now be described in some additional detail with reference to the accompanying drawings. However, the inventive concept may be embodied in many different forms and should not be construed as being limited to only the illustrated embodiments. Rather, the illustrated embodiments are provided so that this disclosure will be thorough and complete, and will fully convey the scope of the invention to those skilled in the art. Throughout the written description and drawings, like reference numbers and labels will be used to denote like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Those skilled in the art will understand that various JEDEC standards are available that characterize and/or define the structure, constitution and/or operating conditions of eMMCs. These standards may be readily obtained and consulted by recourse to http://www.jedec.org. For example, the embedded multimedia card (eMMC) electrical standard, version 4.51 published June 2012 (i.e., JESD84-B451) contains many terms and technical definitions that are useful to an understanding of the inventive concept.

Various embodiments of the inventive concept may include at least one "additional" signal line or signal wire (hereafter, simply "line") having a specific purpose. This additional line will be additive to the standard 10-wire configuration(s) specified by JEDEC. The provision of an additional line within certain embodiments of the inventive concept increases noise immunity and improves transmission speed for data communicated between a host and a device during a data read operation while operating in a dual data rate (DDR) mode. Those skilled in the art will understand the general technical concepts and design options involved in providing a DDR mode of operation—specifically including so-called "DDR 400".

Within various embodiments of the inventive concept, the term "channel" is used to denote a signal path enabling the transmission of one or more electrical signal(s) (e.g., a voltage). As will be understood by those skilled in the art, a channel may include one or more of; circuits acting upon the one or more electrical signal(s), a host pad (and/or pin), an eMMC pad (and/or pin), a line (or collection of lines), a driver—specifically including but not limited to certain differential amplifiers, and a receiver—specifically including but not limited to certain differential amplifiers.

Figure 10:
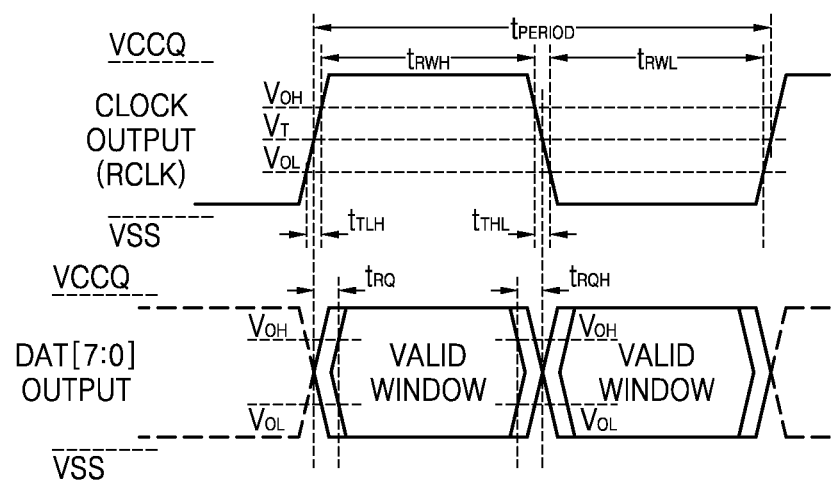
FIG. 10 is a timing diagram illustrating DDR400 device output timing according to embodiments of the inventive concept.

Thus, in certain embodiments of the inventive concept, an eMMC communicates a return clock derived from (or generated based on) a clock received from a host via a dedicated return clock line during read operations performed in accordance with DDR400. As shown in FIG. 10, for example, an edge of the return clock communicated to the host will be synchronous with an edge of read data signals being coincidentally communicated to the host. By making used of the synchronous return clock as a read data strobe, the host may receive and latch the incoming read data in accordance with a maximized "data valid window".

In certain embodiments of the inventive concept, the host and eMMC may use differential signaling in order to eliminate or reduce the influence of noise generated by one or more clocks, such as the return clock.

In certain embodiments of the inventive concept, the host and eMMC may use one or more reference voltage(s) in order to reduce a timing skew between the return clock and read data signals, and/or to maximize the data valid window for the read data despite changes in clock level and/or a detection level for the read data that may arise due to power noise.

As shown in FIG. 6, DDR400 may essentially be redefined as an operating mode within certain embodiments of the inventive concept. That is, the structure and operation of an eMMC system may be redefined to support and more particular version of DDR400. In certain illustrated embodiments that follow, DDR400 will be described as a data processing approach that communicates data at 200 MHz DDR using an input/output (I/O) operating voltage VCCQ of either 1.2V or 1.8 V.

FIG. 1 is a block diagram of an eMMC system 100A according to certain embodiments of the inventive concept. The eMMC system 100A includes a host 200A and a device (eMMC) 300A.

The host 200A may be used to control data processing operations (e.g., read and/or write (read/write) operations. Data processing operations may be performed using a single data rate (SDR) or a double data rate (DDR).

The host 200A may be data processing device, such as a central processing unit (CPU), a processor, a microprocessor, or an application processor, which can process data. The data processing device may be embedded or implemented in an electronic device.

The electronic device may be implemented as a personal computer (PC), a laptop computer, a mobile telephone, a smartphone, a tablet PC, a personal digital assistant (PDA), an enterprise digital assistant (EDA), a digital still camera, a digital video camera, an audio device, a portable multimedia player (PMP), a personal navigation device or portable navigation device (PND), an MP3 player, a handheld game console, or an e-book.

The eMMC 300A may be electrically connected with the host 200A in the electronic device via one or more lines and channels of various arrangement and type.

In FIG. 1, the host 200A includes a clock generator 210, a processing circuit 212, a state control unit 220, and a host controller 230A. The clock generator 210 generates a clock CLK used in the host 200A and the eMMC 300A based on a maximum frequency control signal Fmax. The clock generator 210 may be implemented by a phase locked loop (PLL). The processing circuit 212 may be used to generate certain control signals such as DEC, Fmax, HSE, CTR, VEN, and VREF_ON according an operating mode of the eMMC system, a command CMD communicated from the host to the eMMC, and/or a response RES communicated from the eMMC to the host. In this context, DEC denotes a host differential clock enable signal, HSE denotes a second selection signal, CTR denotes a state control signal, VEN denotes a host differential amplification enable signal, and VREF_ON denotes a host reference voltage enable signal.

The processing circuit 212 may be implemented in hardware, firmware, and/or software, and may be used to generate various command(s) CMD and to analyze (or interpret) various response(s) RES. For example, the processing circuit 212 may be used to analyze data corresponding to eMMC information that is stored in an extended card specific data (CSD) register (or an EXT_CSD register) 371 of the flash memory 370. The processing circuit 212 may also be used to control the exchange (input and/or output) of data between the host 200A and eMMC 300A.

Thus, the processing circuit 212 may be used to control the operation (and inter-operation) of the clock generator 210, processing circuit 212, state control unit 220, and host controller 230A. The state control unit 220 may be used to generate a first selection signal SEL in response to the state control signal CTR.

The host controller 230A of FIG. 1 includes a data input/output (I/O) circuit 240 and a host I/O block 250A. During write operations, the data I/O circuit 240 communicates write data to be written to the flash memory 370 of eMMC 300A via the host I/O block 250A in response to the clock CLK. During read operations, the data I/O circuit 240 receives read data from the flash memory 370 through the host I/O block 250A in response to a selected one of the clock CLK and the return clock RCLK, as determined by a first selection circuit 245.

In the illustrated example of FIG. 1, the data I/O circuit 240 includes a write latch circuit 241, a read latch circuit 243, and the first selection circuit 245. The write latch circuit 241 includes first write latches 241-O and second write latches 241-E. The first write latches 241-O latch odd-numbered data in write data to be written to the eMMC 300A in response to a rising edge of the clock CLK. The second write latches 241-E latch even-numbered data in the write data in response to a falling edge of the clock CLK.

The read latch circuit 243 includes first read latches 243-O and second read latches 243-E. The first read latches 243-O may be sued to latch odd-numbered data bit in read data provided from the eMMC 300A in response to a rising edge of the selected one of the clock CLK and return clock RCLK. The second read latches 243-E may be used to latch even-numbered data bits in the read data in response to a falling edge of the selected one of the clock CLK and the return clock RCLK.

In certain embodiments of the inventive concept, the first selection circuit 245 will be implemented using a multiplexer. In such embodiments, the multiplexer may be used to communicate the clock CLK to the read latch circuit 243 in response to a first level (or "low") first selection signal SEL, or to communicate the return clock RCLK to the read latch circuit 243 in response to a second level (or "high") first selection signal SEL.

Figure 15:
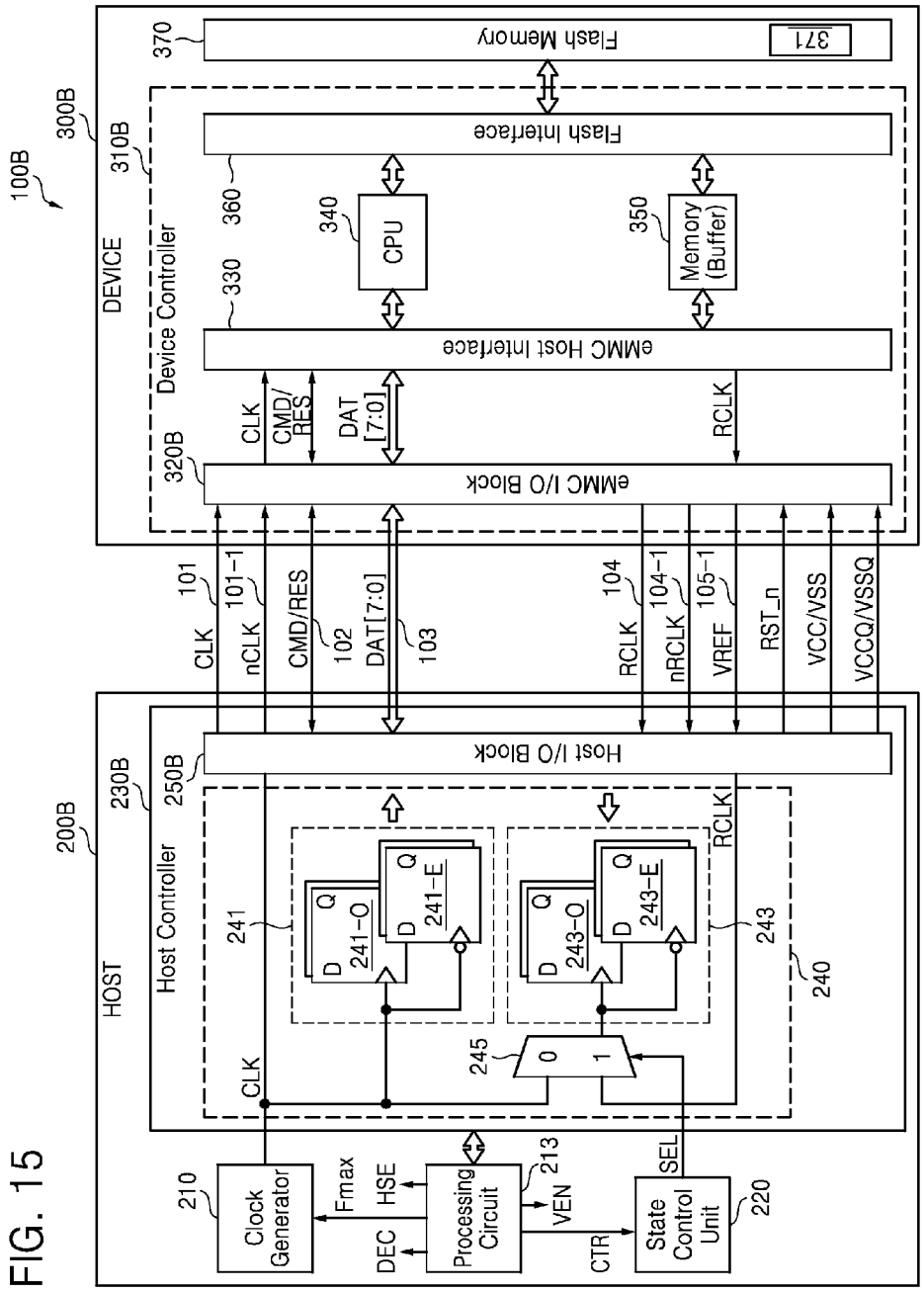
FIG. 15 is a block diagram of an eMMC system according to other embodiments of the inventive concept.

Although hosts 200A and 200B respectively illustrated in FIGS. 1 and 15 include the state control unit 220 and first selection circuit 245, this need not always be the case. For example, the return clock RCLK may be directly applied to the read latch circuit 243.

A "eMMC bus" (e.g., a collection of signal lines) 99 illustrated in FIG. 1 includes the ten (10) lines conventionally specified for eMMC systems by JEDEC (i.e., a unidirectional clock line 101, a bidirectional command/response line 102, and eight (8) bidirectional data bus lines [7:0] 103). The eMMC bus 99 of FIG. 1 also includes a unidirectional complementary clock line 101-1 that communicates a complementary clock nCLK from the host 200A to the eMMC 300A, a unidirectional return clock line 104 that communicates a return clock RCLK from the eMMC 300A to the host 200A, and a unidirectional complementary return clock line 104-1 that communicates a complementary return clock nRCLK from the eMMC 300A to the host 200A. The provision of the return clock RCLK and/or the complementary return clock nRCLK within certain embodiments of the inventive concept allows for increased read data communication speed and expanded data throughput.

During a write operation performed by the eMMC system 100A, the bidirectional data bus 103 may be configured to communicate write data to the eMMC 300A via a plurality of corresponding data channels. During a read operation performed by the eMMC system 100A, the bidirectional data bus 103 may be configured to communicate read data to the host 200A via the plurality of corresponding data channels.

The eMMC bus 99 of FIG. 1 may also include a reset line RST_n that may be used to communicate a reset signal from the host 200A to the eMMC 300A. The eMMC bus 99 of FIG. 1 may also include one or more operating voltage power line(s) capable of communicating one or more operating voltages, such as VCCQ and VSSQ used by I/O blocks 250A and 320A, and/or core operating voltages VCC and VSS).

Thus, certain embodiments of the inventive concept incorporating a driver for a differential amplifier, or a receiver including a differential amplifier in the I/O blocks 250A and 320A may benefit from provision of I/O operating voltages VCCQ and VSSQ by the host 200A. Similarly, certain embodiments of the inventive concept may benefit from the provision by the host 200A of core operating voltages VCC and VSS used by the flash memory 370. Operating voltages VSSQ and VSS may be ground voltage in certain embodiments.

Additionally, certain embodiments of the inventive concept will include the eMMC bus 99 having a reference voltage line 105. The reference voltage line 105 may be used to either communicate a reference voltage VREF from the host 200A to the eMMC system 100A (per FIG. 1), or to communicate the reference voltage VREF from the eMMC 300A to the host 200A.

In FIG. 1, the eMMC 300A includes a device (eMMC) controller 310A and the flash memory 370. The eMMC controller 310A controls the communication of data between the host 200A and flash memory 370. The eMMC controller 310A includes the eMMC I/O block 320A, an eMMC host interface 330, a CPU 340, a memory 350, and a flash interface 360.

The eMMC host interface 330 receives the clock CLK and the command CMD via the eMMC I/O block 320A, generates the return clock RCLK based on the clock CLK, communicates the return clock RCLK to the eMMC I/O block 320A, analyzes the command CMD, generates the response RES according to an analysis result, and communicates the response RES and data generated based on the response RES to the eMMC I/O block 320A.

During write operations, the eMMC host interface 330 may be used to temporarily store write data is received via the eMMC I/O block 320A in the buffer memory 350 in response to the clock CLK and under the control of the CPU 340. Thus, the flash interface 360 may read the temporarily stored write data from the buffer memory 350, and write it to the flash memory 370 under the control of the CPU 340.

During read operations, the flash interface 360 may be used to store read data retrieved from the flash memory 370 in the buffer memory 350 under the control of the CPU 340. Thus, the eMMC host interface 330 may read the read data temporarily stored in the buffer memory 350, and communicates it to the eMMC I/O block 320A using the clock CLK or the return clock RCLK and under the control of the CPU 340.

The CPU 340 controls the operations of the interfaces 330 and 360 and controls the overall operation of the eMMC 300A. The buffer memory 350 may be implemented using volatile memory (e.g., DRAM and/or SRAM).

The flash memory 370 may be used to store data in a nonvolatile manner. When the flash memory 370 is implemented by NAND flash memory, the flash interface 360 may be implemented by a NAND flash interface. The flash memory 370 of FIG. 1 is assumed to include the EXT_CSD register 371 that may be used to store "eMMC information" (or rather "eMMC data" corresponding to eMMC information). The eMMC information may be used to characterize the properties and operating modes of the eMMC 100A.

The host 200A may obtain the eMMC information by reading the eMMC data from the EXT_CSD register 371 using a SEND_EXT_CSD command (=CMD8). In certain embodiments, the eMMC data stored by the EXT_CSD register 371 will be 512 bytes long.

Figure 2:
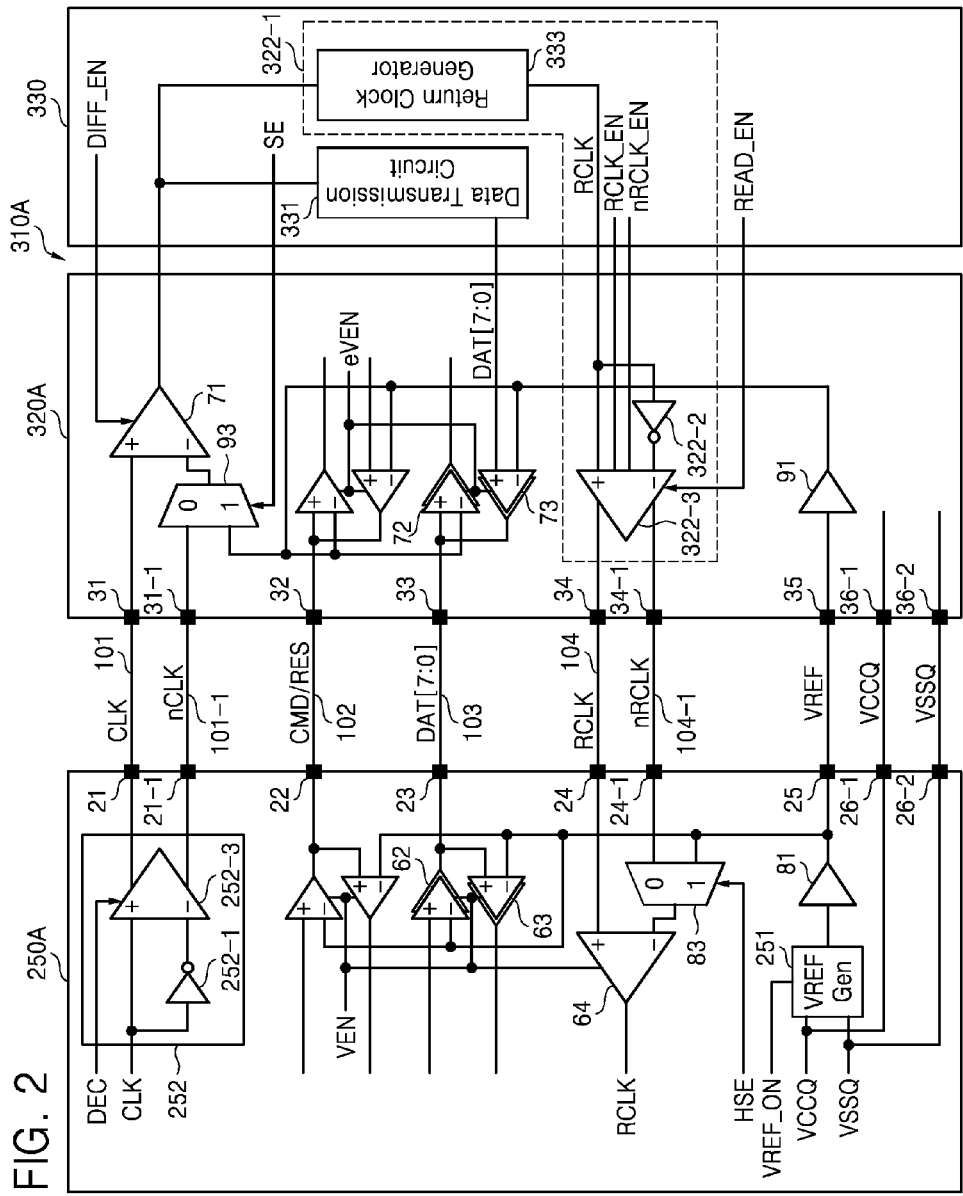
FIG. 2 is a block diagram further illustrating the eMMC system of FIG. 1.
Figure 3:
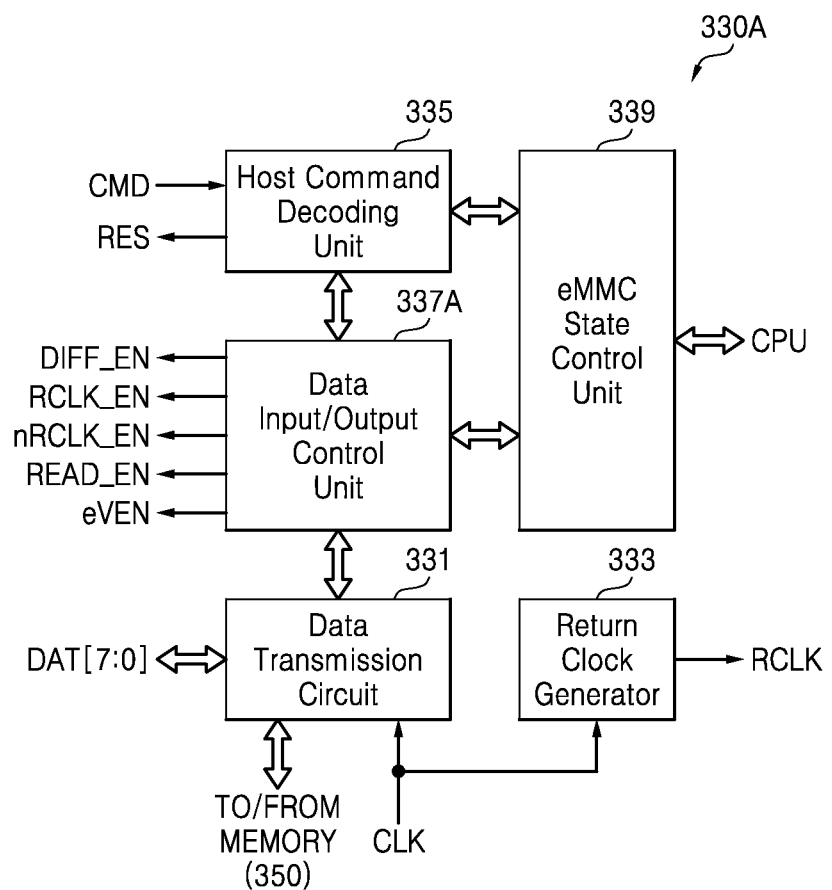
FIG. 3 is an internal block diagram further illustrating the eMMC host interface of FIG. 1.

FIG. 2 is a block diagram further illustrating portions of the eMMC system 100A of FIG. 1 related to the return clock. FIG. 3 is a block diagram further illustrating the eMMC host interface 330 of FIG. 1.

Referring to FIGS. 1 and 2, the host I/O block 250A includes a differential clock generator 252, differential amplifiers 62, 63, and 64, a second selection circuit 83, a reference voltage generator 251, a driver 81, and host pads 21 through 26-2.

The differential clock generator 252 outputs the differential clocks CLK and nCLK, which toggle complementarily with each other, through the host pads 21 and 21-1, respectively, based on the host differential clock enable signal DEC that has been activated. In this context, the term "toggle" is used to describe a periodic signal (such as a clock) that transitions from one level (or state) to another level (or state) (e.g., "high" and "low" levels, or high/low states) over a given period. A "toggling signal" is distinct from "DC signal", where a direct current (DC) signal has a constant level over a given period. Ground voltage is an example of a DC signal.

Thus, the differential clock generator 252 may be used to output the clock CLK and the complementary clock nCLK, one or both of which having in certain embodiments a DC level (e.g., ground voltage VSSQ), and one or both of which having in other embodiments a toggling level. These clock signals may be provided at the host pads 21 and 21-1, respectively, based on the host differential clock enable signal DCE that has been deactivated.

The differential clock generator 252 of FIG. 2 includes an inverter 252-1 inverting the clock CLK and a differential amplifier 252-3 amplifying a difference between the clock CLK and an output signal of the inverter 252-1. The differential amplifier 252-3 generates the differential clocks CLK and nCLK or the clock CLK and the complementary clock nCLK having the DC level.

The differential amplifiers 62, 63, and 64 amplify a difference between a signal input to a positive (+) input terminal and a signal input to a negative (−) input terminal based on the host differential amplification enable signal VEN that has been activated. However, the differential amplifiers 62, 63, and 64 amplify only the signal input to the positive input terminal based on the host differential amplification enable signal VEN that has been deactivated.

The second selection circuit 83 communicates one of a signal input through the host pad 24-1 and an output signal of the driver 81 to the negative input terminal of the differential amplifier 64 based on the second selection signal HSE.

The reference voltage generator 251 may be used to generate the reference voltage VREF using the I/O operating voltages VCCQ and VSSQ in response to the host reference voltage enable signal VREF_ON that has been activated. The reference voltage generator 251 may be implemented in certain embodiments by a voltage divider.

For example, the reference voltage VREF may be half of the I/O operating voltage VCCQ. However, the reference voltage generator 251 is disabled in response to the host reference voltage enable signal VREF_ON that has been deactivated. The level of the reference voltage VREF may be adjusted by the reference voltage generator 251. The driver 81 drives the reference voltage VREF output from the reference voltage generator 251.

The eMMC I/O block 320A includes eMMC pads 31 through 36-2, a third selection circuit 93, differential amplifiers 71, 72, and 73, a part of differential return clock generator 322-1, and a receiver 91.

The third selection circuit 93 communicates one of a signal input through the eMMC pad 31-1 and the reference voltage VREF to a negative input terminal of the differential amplifier 71 based on a third selection signal SE.

For instance, the third selection circuit 93 communicates the signal input through the eMMC pad 31-1 to the negative input terminal of the differential amplifier 71 when the third selection signal SE is at a first level and communicates an output signal of the receiver 91 to the negative input terminal of the differential amplifier 71 when the third selection signal SE is at a second level.

The differential amplifier 71 amplifies a difference between a signal input through its positive input terminal and a signal input through its negative input terminal in response to an eMMC differential clock enable signal DIFF_EN that has been activated.

However, the differential amplifier 71 amplifies only the signal input through the positive input terminal in response to the eMMC differential clock enable signal DIFF_EN that has been deactivated.

The differential amplifiers 72 and 73 amplify a difference between a signal input through a positive input terminal and a signal input through a negative input terminal based on an eMMC differential amplification enable signal eVEN that has been activated. However, the differential amplifiers 72 and 73 amplify the signal input through the positive input terminal based on the eMMC differential amplification enable signal eVEN that has been deactivated.

The differential return clock generator 322-1 generates the differential return clocks RCLK and nRCLK, i.e., the return clock RCLK and the complementary return clock nRCLK based on the output signal CLK of the differential amplifier 71. The differential return clock generator 322-1 includes a return clock generator 333, an inverter 322-2, and a differential amplifier 322-3.

The return clock generator 333 generates the return clock RCLK based on the output signal CLK of the differential amplifier 71. The structure and the operations of the return clock generator 333 will be described in detail with reference to FIGS. 4 and 5 later.

The inverter 322-2 inverts the return clock RCLK. During write operations, a read enable signal READ_EN is deactivated. Accordingly, during write operations, the differential amplifier 322-3 outputs the differential return clocks RCLK and nRCLK having a DC level through the eMMC pads 34 and 34-1, respectively. The receiver 91 receives the reference voltage VREF.

Referring to FIG. 3, an eMMC host interface 330A, an example of the eMMC host interface 330, includes the data transmission circuit 331, the return clock generator 333, a host command decoding unit 335, a data I/O control unit 337A, and an eMMC state control unit 339.

During read operations in DDR400 mode, the data transmission circuit 331 communicates the read data to the differential amplifiers 73 in response to the clock CLK output from the differential amplifier 71. The return clock generator 333 generates the return clock RCLK based on the output signal CLK of the differential amplifier 71.

Figure 4:
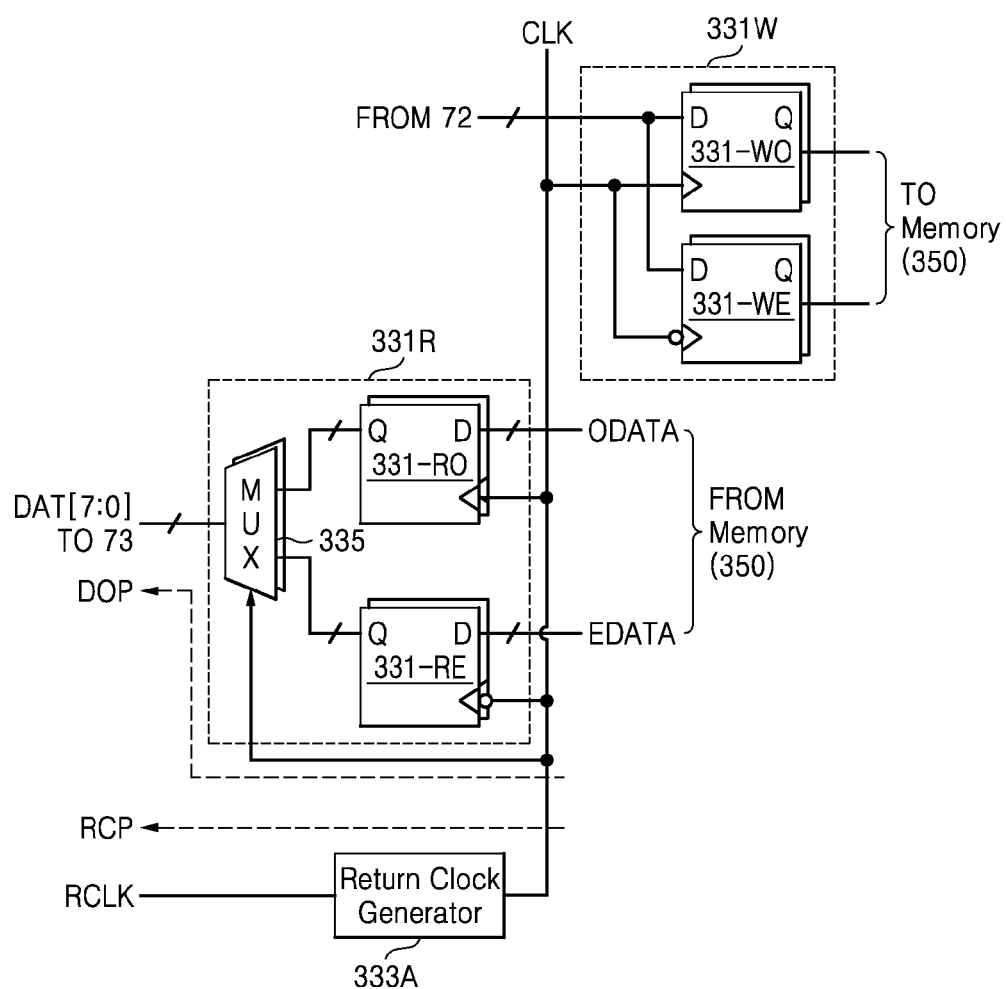
FIGS. 4 and 5 are respective circuit diagrams further illustrating portions of the eMMC system of FIG. 1 including the return clock generator according to certain embodiments of the inventive concept.

FIG. 4 is a circuit diagram further illustrating portions of the eMMC system 100A of FIG. 1 related to the return clock generator 333A according to certain embodiments of the inventive concept. Referring to FIGS. 2, 3 and 4, the data transmission circuit 331 includes a read latch circuit 331R and a write latch circuit 331W.

During read operations, the read latch circuit 331R is enabled according to the control of the data I/O control unit 337A or the eMMC state control unit 339. During write operations, the write latch circuit 331W is enabled according to the control of the data I/O control unit 337A or the eMMC state control unit 339.

The read latch circuit 331R includes first data output latches 331-RO and second data output latches 331-RE. During read operations, the first data output latches 331-RO may be used to latch odd-numbered data bits ODATA among the read data output from the buffer memory 350 in response to a rising edge of the clock CLK output from the differential amplifier 71. During read operations, the second data output latches 331-RE may be used to latch even-numbered data bits EDATA among the read data output from the buffer memory 350 in response to a falling edge of the clock CLK output from the differential amplifier 71.

A fourth selection circuit 335 outputs the odd-numbered data ODATA latched by the first data output latches 331-RO to the differential amplifiers 73 in response to a rising edge of the clock CLK and outputs the even-numbered data EDATA latched by the second data output latches 331-RE to the differential amplifiers 73 in response to a falling edge of the clock CLK. The fourth selection circuit 335 may be implemented by a multiplexer.

The differential amplifiers 73 output the odd-numbered data ODATA and the even-numbered data EDATA, which are sequentially output from the fourth selection circuit 335, to the host pads 33.

The write latch circuit 331W includes first data input latches 331-WO and second data input latches 331-WE. During write operations, the first data input latches 331-WO may be used to communicate odd-numbered data ODATA among write data output from the differential amplifiers 72 to the buffer memory 350 in response to a rising edge of the clock CLK output from the differential amplifier 71. During write operations, the second data input latches 331-WE may be used to communicate even-numbered data EDATA among the write data output from the differential amplifiers 72 to the buffer memory 350 in response to a falling edge of the clock CLK output from the differential amplifier 71.

During write operations in DDR400 mode, the return clock generator 333A may be used to generate the return clock RCLK by delaying the clock CLK output from the differential amplifier 71 by a predetermined delay period under the control of the data I/O control unit 337A or the eMMC state control unit 339.

The return clock generator 333A may be implemented by a delay logic. The delay of the delay logic may be adjustable or programmable. When the delay or latency of a data output path DOP including the read latch circuit 331R is designed or adjusted to be the same as that of a return clock output path RCP including the return clock generator 333A, as shown in FIG. 10 the return clock generator 333A may output through the eMMC pad 34 the return clock RCLK synchronously with the data signals used to communicate the read data output through the eMMC pads 33.

The return clock RCLK may be used by the host 200A as a strobe signal during high-speed data read operations. Accordingly, the read data may be stably stored in the read latch circuit 240 according to a maximized valid data window.

Figure 5:
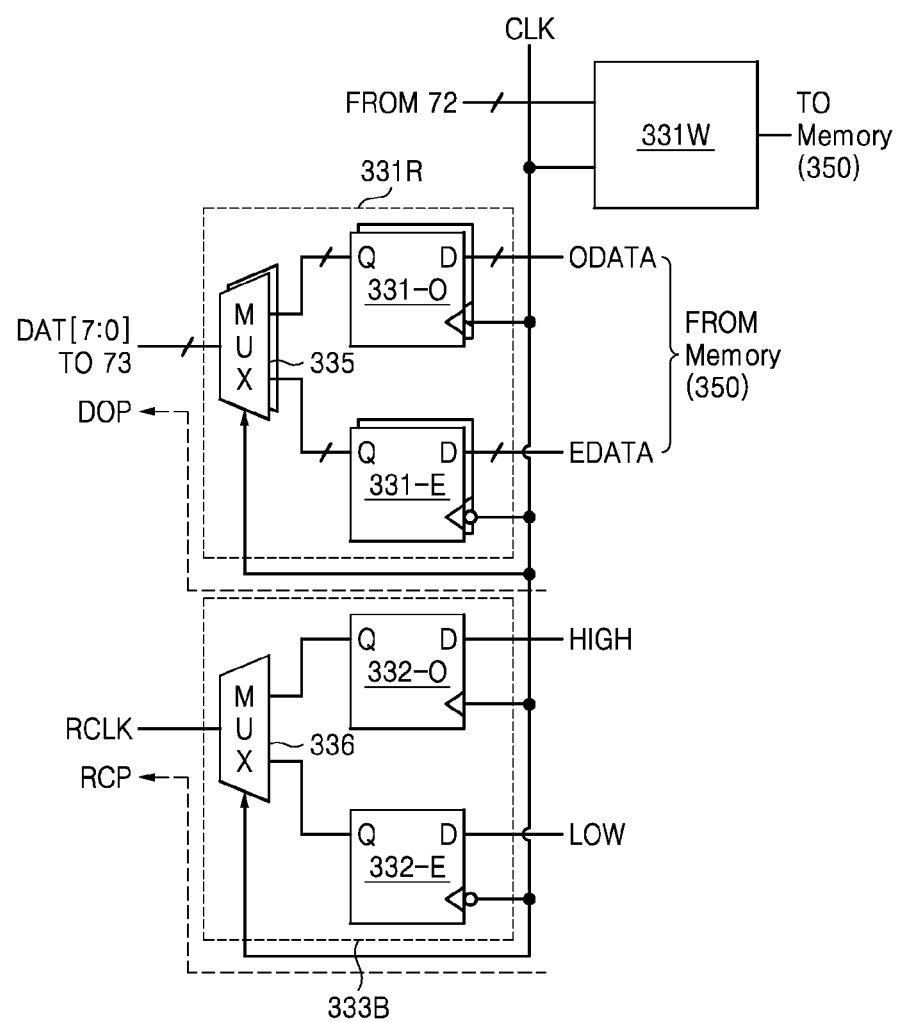

FIG. 5 is a circuit diagram further illustrating portions of the eMMC system 100A of FIG. 1 related to the return clock generator 333B according to certain embodiments of the inventive concept. The structure and the operations of the data transmission circuit 331 illustrated in FIG. 5 may be substantially the same the structure and operation of the data transmission circuit 331 illustrated in FIG. 4. Here, "being substantially the same" means being physically the same and/or being the same with consideration of process variations, e.g., process, voltage and temperature (PVT) variations.

The return clock generator 333B, another example of the return clock generator 333 illustrated in FIG. 2, includes latches 332-O and 332-E and a fifth selection circuit 336. The first latch 332-O latches a high level (HIGH) in response to a rising edge of the clock CLK output from the differential amplifier 71 and the second latch 332-E latches a low level LOW in response to a falling edge of the clock CLK output from the differential amplifier 71. For instance, the high level may correspond to the I/O operating voltage VCCQ and the low level LOW may correspond to the I/O operating voltage VSSQ.

The fifth selection circuit 336 outputs the high level latched by the first latch 332-O as a part of the return clock RCLK in response to a rising edge of the clock CLK output from the differential amplifier 71. Also, the fifth selection circuit 336 outputs the low level LOW latched by the second latch 332-E as a part of the return clock RCLK in response to a falling edge of the clock CLK output from the differential amplifier 71. The fifth selection circuit 336 may be implemented by a multiplexer.

The structure of the data output path DOP may be substantially the same as that of the return clock output path RCP. Accordingly, a potential timing skew between the data DAT [7:0] and return clock RCLK communicated to the host 200A may be eliminated or markedly reduced.

FIG. 10 is a timing diagram for a DDR400 device illustrating output timing considerations according to certain embodiments of the inventive concept. Referring to FIG. 10, when the delay of the differential amplifiers 73 and 322-3 is not considered, or the differential amplifiers 73 and 322-3 have the same delay, the eMMC 300A generates the return clock RCLK having edges synchronized with edges (e.g., rising and falling edges) of the data DAT[7:0] during the read operations in DDR400 mode.

Referring back to FIG. 3, the host command decoding unit 335 may be used to receive a command CMD from the host 200A via the command/response line 102, the eMMC pad 32, and a differential amplifier connected to the eMMC pad 32. The host command decoding unit 335 may also be used to decode the command CMD, generate the response RES according to a decoding result, and communicate the response RES to the host 200A. For instance, when a received command CMD is the SEND_EXT_CSD command (CMD8), the data transmission circuit 331 may communicate the eMMC data stored in the EXT_CSD register 371 to the buffer memory 350, and then to the host 200A via the components 73, 33, and 103 under the control of at least one of the components 335, 337A, and 339. When the received command CMD is a SWITCH command (CMD6), the data transmission circuit 331 may communicate the eMMC data received by the host 200A through the buffer memory 350 under the control of at least one of the components 335, 337A, and 339.

The host command decoding unit 335 may then communicate the decoding results for the command CMD to the data I/O control unit 337A and/or the eMMC state control unit 339. The host command decoding unit 335 may also communicate control signals generated in response to given response RES to the data I/O control unit 337A and/or the eMMC state control unit 339.

The data I/O control unit 337A may be used to control activation/deactivation of the enable signals DIFF_EN, RCLK_EN, nRCLK_EN, READ_EN, and eVEN according to the operation of the host command decoding unit 335, the operation of the eMMC state control unit 339, and/or the eMMC data stored in the EXT_CSD register 371. The eMMC state control unit 339 may control the state of the eMMC 300A based on the control of the CPU 340, communication with the host command decoding unit 335, and/or communication with the data I/O control unit 337A.

The operation of the eMMC 100A according to a specified operating mode and information (e.g., as indicated by data values for bits 4, 5, and 6 of a VENDOR_SPECIFIC_FIELD of the EXT_CSD register 371) will be described below in relation to FIG. 13.

FIG. 6 is a table listing a set of possible "device type" designations that may be made for an eMMC according to certain embodiments of the inventive concept. Referring to FIG. 6, a DEVICE_TYPE[196] field of the EXT_CSD register 371 is used to designate a type of the eMMC 300A. While only bits 0 through 5 of the DEVICE_TYPE[196] field are defined in the JESD84-B451 standard identified above, information indicating whether the eMMC 300A supports DDR400 may be stored in the DEVICE_TYPE[196] field in certain embodiments of the inventive concept.

For instance, information indicating whether or not a 200 MHz DDR mode is supported at a voltage of 1.8 V (i.e., VCCQ=1.8 V) may be located at bit 6, and information indicating whether or not a 200 MHz DDR mode is supported at a voltage of 1.2 V (i.e., VCCQ=1.2 V) may be located at bit 7.

The DEVICE_TYPE[196] field of the EXT_CSD register 371 may be communicated from the eMMC 300A to the host 200A in response to a SEND_EXT_CSD command (CMD8) communicated from the host 200A. Accordingly, the host 200A may readily determine whether the eMMC 300A supports DDR400 based on the state of bit 6 or bit 7 in the DEVICE_TYPE[196] field of the EXT_CSD register 371.

FIG. 7, inclusive of FIGS. 7A and 7B, illustrates HS_TIMING and HS_TIMING values according to certain embodiments of the inventive concept. An HS_TIMING[185] field of the EXT_CSD register 371 may be used by the host 200A to select a timing interface and driver strength. In the certain embodiments of the inventive concept, "0x3" is added to the HS_TIMING[185] field.

When the host 200A sets the HS_TIMING[185] field to "1", the eMMC 300A changes to high speed interface timing. When the host 200A sets the HS_TIMING[185] field to "2", the eMMC 300A changes to HS200 interface timing.

When the host 200A sets the HS_TIMING[185] field to "3", the eMMC 300A changes to DDR400 interface timing. Embodiments of the DDR400 interface timing for the DDR400 mode are illustrated in FIGS. 8 through 11. In other words, the host 200A issues the SWITCH command (CMD6) to set a DDR400 bit and a driver strength value in the HS_TIMING[185] field of the EXT_CSD register 371.

Figure 8:
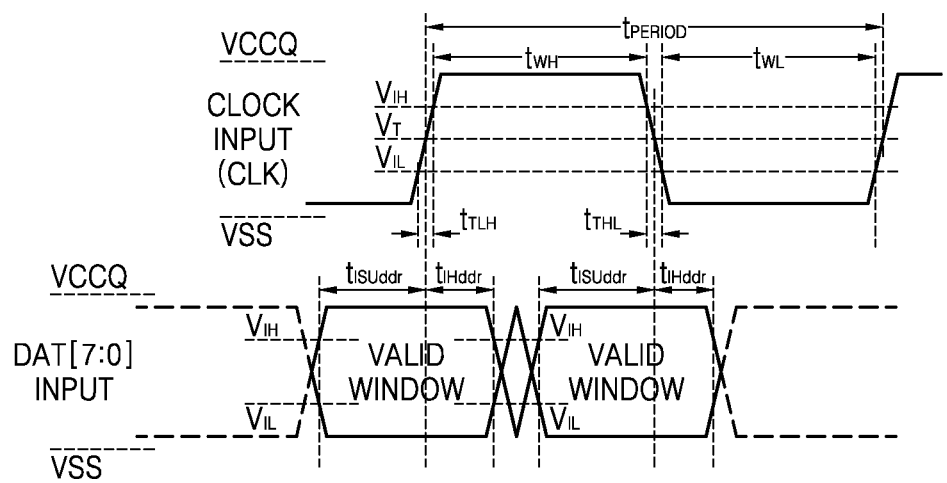
FIG. 8 is a timing diagram illustrating dual data rate (DDR) 400 device input timing according to embodiments of the inventive concept.

FIG. 8 is a timing diagram illustrating DDR400 device input timing considerations for certain embodiments of the inventive concept. FIG. 9 is a table listing parameters related to the timing diagram of FIG. 8. And as noted above, FIG. 10 is a timing diagram illustrating DDR400 device output timing considerations according to certain embodiments of the inventive concept, and FIG. 11 is a table listing parameters related to the timing diagram of FIG. 10.

With reference to FIGS. 1, 2, 10 and 11, one possible DDR400 mode of operation is shown, wherein the edges of the return clock RCLK are synchronous with the edges of output data DAT[7:0] provided at the eMMC pads 33 and 34.

The return clock generators 333A and 333B (collectively denoted by 333) delay the clock CLK by a predetermined delay period, thereby generating the return clock RCLK synchronized with the output data DAT[7:0]. Accordingly, the eMMC 300A reduces a potential timing skew between the output data DAT[7:0] OUTPUT and the return clock RCLK in order to secure a maximum data valid window.

In FIGS. 8, 9, 10 and 11, $t_{RQ}$ and $t_{RQH}$ denote alternating current (AC) timing parameters for parallel data output DAT[7:0] provided to output to the host 200A. These parameters characterize the timing skew between the output data DAT[7:0] and the return clock RCLK. In other words, $t_{RQ}$ denotes an output hold skew and $t_{RQH}$ denotes an output hold time. The output hold skew $t_{RQ}$ is a restriction that holds data until an edge of the return clock RCLK occurs and the output hold time $t_{RQH}$ is a restriction on time taken till the data should be normal since the edge of the return clock RCLK occurs. $V_{IH}$ denotes an input high voltage and $V_{IL}$ denotes an input low voltage.

As shown in FIG. 10, while the eMMC 300A is operating in DDR400, the return clock RCLK may be used to read data. That is, it may be used for block oriented data read or cyclic redundancy check (CRC) status response read. During write operations or while the eMMC 300A is not providing output data to the host 200A, the level of the return clock RCLK may be maintained at a high-impedance (high-Z) state, for example.

During read operations performed in the DDR400 mode, the return clock RCLK is toggled during a data valid period.

The eMMC 300A may set a direction of the return clock RCLK, and may also set a default level for the return clock RCLK using a pull-down circuit.

FIG. 12 is a table listing information regarding the maximum frequency of the clock CLK in certain DDR400 modes of operation. This information may be stored in the VENDOR_SPECIFIC_FIELD of the EXT_CSD register 371 in certain embodiments of the inventive concept. Referring to FIGS. 1 and 12, eMMC information defining a maximum frequency for the clock CLK that may be used in conjunction with a current operating mode of the eMMC 300A (e.g., in DDR400 mode) may be stored in the VENDOR_SPECIFIC_FIELD, e.g., CSD slice[122], of the EXT_CSD register 371. In such embodiments, when the host 200A communicates a command CMD requesting information about the maximum frequency of the clock CLK to the eMMC 300A, the eMMC 300A will then communicate the eMMC information stored in the VENDOR_SPECIFIC_FIELD, i.e., CSD slice[122] of the EXT_CSD register 371 to the host 200A.

Accordingly, the processing circuit 212 then interprets the eMMC information stored in the CSD slice[122] and communicates a corresponding maximum frequency control signal (Fmax) to the clock generator 210. Then, the clock generator 210 may be used to generate the clock CLK having the defined maximum frequency (e.g., 52, 100, 133, 166 or 200 MHz) as indicated by each one of types Type0, Type 1, Type2, Type 3, and Type4 shown in FIG. 12.

FIG. 13 is a table listing definition(s) of an extra I/O field in the DDR400 mode, which may be stored in the VENDOR_SPECIFIC_FIELD of the EXT_CSD register 371 in certain embodiments of the inventive concept.

Referring to FIGS. 1 and 13, information regarding the properties of the eMMC 300A (e.g., complementary clock nCLK support, complementary return clock nRCLK support, and reference voltage VREF support) during read operations in DDR400 may be stored in the VENDOR_SPECIFIC_FIELD, i.e., the CSD slice[122] of the EXT_CSD register 371 in certain embodiments of the inventive concept.

For instance, the host 200A may communicate a command CMD to the eMMC 300A requesting the information regarding eMMC support for nCLK, nRCLK, and VREF during read operations in DDR400 mode. As described above, such additional control signals may be exchanged between the host 200A and eMMC 300A via corresponding additional lines of eMMC bus 99 in certain embodiments of the inventive concept. In response, the eMMC 300A may return eMMC information stored in the VENDOR_SPECIFIC_FIELD, i.e., the CSD slice[122] of the EXT_CSD register 371 to the host 200A.

The host 200A may then interpret received eMMC information contained in the CDS slice[120], as well as the eMMC information contained in bits 4, 5, and 6 of the VENDOR_SPECIFIC_FIELD of the EXT_CSD register 371 using the SWITCH command (CMD6).

Figure 16:
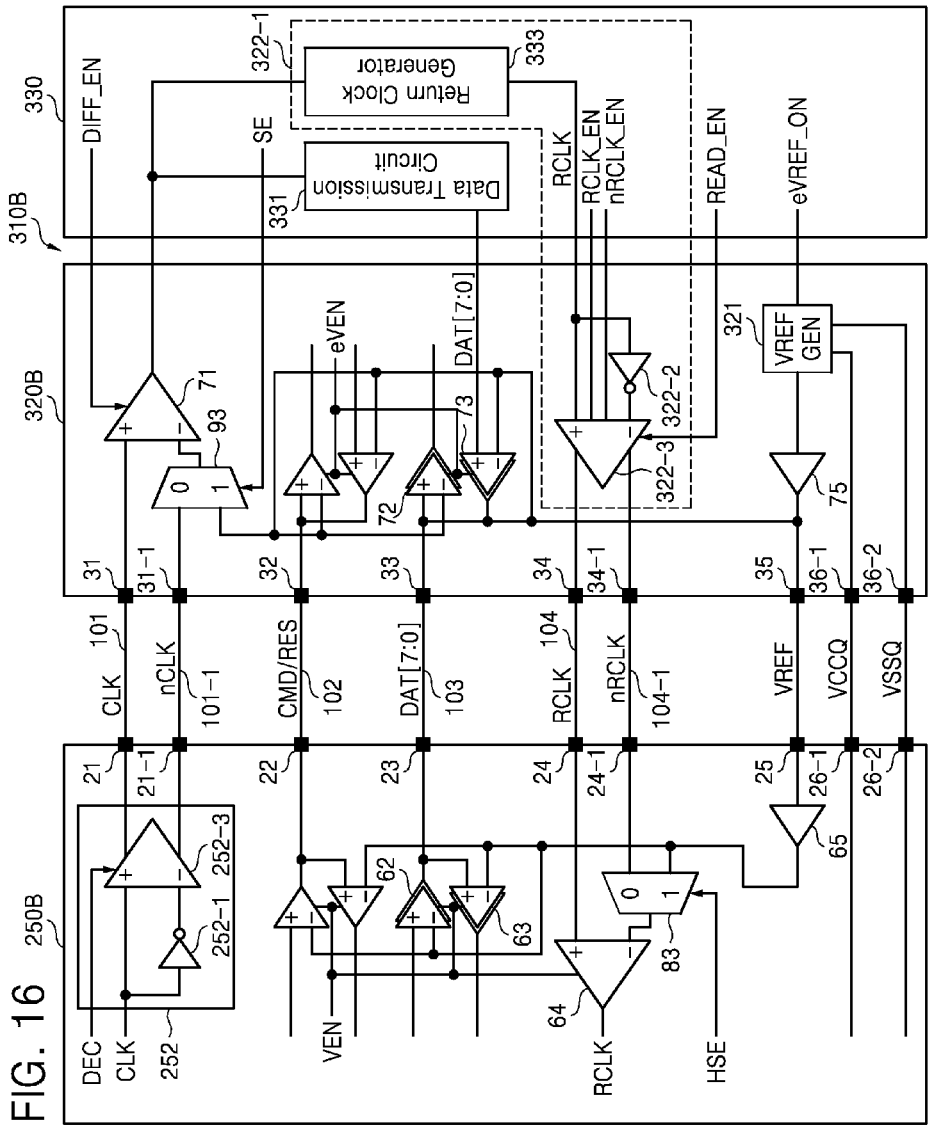
FIG. 16 is a diagram of a part of the eMMC system illustrated in FIG. 15.

According to the bits 0, 1, and 2, as well as bits 4, 5 and 6 of the extra I/O field, the host 200A and/or eMMC 300A may operate in accordance with (e.g.,) one of the operating mode examples described hereafter, or one of operating mode examples described hereafter with reference to FIGS. 15 and 16.

Thus, certain operating modes for an eMMC system may be determined in relation to the full DDR400 compatibility, DDR400 write operation compatibility, and/or DDR400 read operation compatibility provided by the eMMC in the eMMC system. For example, DDR400 may be a mode in which the eMMC 300A of FIG. 1 operates at 200 MHz DDR with I/O operating voltage (VCCQ) of 1.2V or 1.8V in accordance with a "type designation" for the eMMC 300A made by information stored in a DEVICE_TYPE[196] field of the EXT_CSD register 371 as shown in FIG. 6.

Assuming this technical predicate, a number of specific operating mode examples will now be described. In relation to the operating mode examples, as well as the examples described in relation to FIGS. 15 and 16, FIG. 14 is a table listing signals that may be communicated in an eMMC system according to certain embodiments of the inventive concept. That is, FIG. 14 lists by name, type, and description each of the signals referenced in foregoing embodiments and assumed in the operating mode examples that follow. Here, nCLK and CLK_n may denote the same signal, and nRCLK and RCLK_n may denote the same signal.

Example 1 nCLK, RCLK, nRCLK, and VREF Not Used

Here, the eMMC 300A is type designated in accordance with bit 5 as shown in FIG. 6 (i.e., eMMC 300A supports a 200 MHz or less single data rate (SDD) operating mode using 1.2V), and accordingly the processing circuit 212 deactivates the enable signals DEC, VEN, and VREF_ON based on the command CMD and data values stored in an extra I/O field illustrated in FIG. 13. In addition, based on the command CMD and the values stored in the extra I/O field illustrated in FIG. 13, the data I/O control unit 337A deactivates the enable signals DIFF_EN, eVEN, RCLK_EN, nRCLK_EN, and READ_EN.

The differential clock generator 252 communicates the clock CLK to the differential amplifier 71 through the components 21, 101, and 31 in response to the host differential clock enable signal DEC that has been deactivated. At this time, the differential clock generator 252 also outputs the complementary clock nCLK having a DC level, e.g., the level of the ground voltage VSSQ.

During write operations, the differential amplifiers 62 amplify only signal input through the positive input terminal in response to the host differential amplification enable signal VEN that has been deactivated.

During read operations, the differential amplifiers 63 and 64 amplify only signal input through the positive input terminal in response to the host differential amplification enable signal VEN that has been deactivated.

The reference voltage generator 251 generates the reference voltage VREF having the DC level in response to the host reference voltage enable signal VREF_ON that has been deactivated. The differential amplifier 71 amplifies only the clock CLK in response to the eMMC differential clock enable signal DIFF_EN that has been deactivated.

During write operations, the differential amplifiers 72 amplify only signal input through the positive terminal in response to the eMMC differential amplification enable signal eVEN that has been deactivated.

During read operations, the differential amplifiers 73 amplify only signal input through the positive input terminal in response to the eMMC differential amplification enable signal eVEN that has been deactivated.

During the read and write operations, the differential amplifier 322-3 outputs the signals RCLK and nRCLK having the DC level in response to the enable signals RCLK_EN, nRCLK_EN, and READ_EN that have been deactivated.

Of additional note, when the eMMC 300A performs the write operations in DDR400 mode, the processing circuit 212 deactivates the enable signals DEC, VEN, and VREF_ON based on the command CMD and the values stored in the extra I/O field illustrated in FIG. 13. And based on the command CMD, e.g., data write command, and the values stored in the extra I/O field illustrated in FIG. 13, the data I/O control unit 337A deactivates the enable signals DIFF_EN, eVEN, RCLK_EN, nRCLK_EN, and READ_EN.

Example 2

Only RCLK is Used

When the eMMC 300A performs read operations in DDR400 mode, and bits 0, 1, 2, 4, 5, and 6 illustrated in FIG. 13 are set to "0", the processing circuit 212 deactivates the enable signals DEC, VEN, and VREF_ON based on the command CMD, e.g., data read command, and the values stored in the extra I/O field illustrated in FIG. 13. And based on the command CMD and the values stored in the extra I/O field illustrated in FIG. 13, the data I/O control unit 337A deactivates the enable signals DIFF_EN, eVEN, and nRCLK_EN and activates the enable signals RCLK_EN and READ_EN. Accordingly, the return clock RCLK provided by the differential amplifier 322-3 is communicated to the differential amplifier 64 through the components 34, 104, and 24.

The differential amplifier 64 amplifies the return clock RCLK input through the positive input terminal. At this time, the selection signals HSE and SE may have any of the first and second levels.

Example 3

RCLK and VREF are Used

When the eMMC 300A performs read operations in DDR400 mode, and bits 2 and 6 illustrated in FIG. 13 are set to "1", the processing circuit 212 deactivates the host differential clock enable signal DEC and activates the enable signals VEN and VREF_ON based on the command CMD and the values stored in the extra I/O field illustrated in FIG. 13. And based on the command CMD and the values stored in the extra I/O field illustrated in FIG. 13, the data I/O control unit 337A deactivates the enable signals DIFF_EN and nRCLK_EN and activates the enable signals eVEN, RCLK_EN and READ_EN. At this time, the processing circuit 212 generates the second selection signal HSE at the second level and the data I/O control unit 337A generates the third selection signal SE at either of the first and second levels.

The reference voltage generator 251 generates the reference voltage VREF based on the I/O operating voltages VCCQ and VSSQ. The driver 81 communicates the reference voltage VREF output from the reference voltage generator 251 to the receiver 91 through the components 25, 105, and 35.

The differential amplifiers 73 respectively amplify differences between the reference voltage VREF output from the receiver 91 and the data DAT[7:0] output from the data transmission circuit 331 and communicate the amplified data DAT[7:0] to the differential amplifiers 63, respectively, through the components 33, 103, and 23.

The differential amplifiers 63 respectively amplify differences between the reference voltage VREF and the data DAT[7:0] received through the host pads 23. The second selection circuit 83 communicates the reference voltage VREF output from the driver 81 to the negative input terminal of the differential amplifier 64 in response to the second selection signal HSE at the second level.

The differential amplifier 64 amplifies a difference between the return clock RCLK input through the positive input terminal and the reference voltage VREF input through the negative input terminal. The read latch circuit 243 processes, e.g., latches, the data DAT[7:0] that has been amplified by the differential amplifiers 63 in response to the clock CLK or the return clock RCLK that has been amplified by the differential amplifier 64.

Example 4

RCLK and nCLK are Used

When the eMMC 300A performs read operations in DDR400 mode, and bits 0 and 4 illustrated in FIG. 13 are set to "1", the processing circuit 212 activates the host differential clock enable signal DEC and deactivates the enable signals VEN and VREF_ON based on the command CMD and the values stored in the extra I/O field illustrated in FIG. 13. And based on the command CMD and the values stored in the extra I/O field illustrated in FIG. 13, the data I/O control unit 337A deactivates the enable signals eVEN and nRCLK_EN and activates the enable signals DIFF_EN, RCLK_EN, and READ_EN. At this time, the processing circuit 212 generates the second selection signal HSE at either of the first and second levels and the data I/O control unit 337A generates the third selection signal SE at the first level.

The differential clock generator 252 outputs the differential clocks, i.e., the clock CLK and the complementary clock nCLK to the eMMC pads 31 and 31-1, respectively, through the components 21, 101, 21-1, and 101-1. The third selection circuit 93 outputs the complementary clock nCLK to the negative input terminal of the differential amplifier 71 in response to the third selection signal SE at the first level.

The differential amplifier 71 amplifies a difference between the clock CLK input through the positive input terminal and the complementary clock nCLK input through the negative input terminal. The differential amplifier 322-3 communicates the return clock RCLK output from the return clock generator 333 to the positive input terminal of the differential amplifier 64 through the components 34, 104, and 24. The differential amplifier 64 outputs the return clock RCLK that has been amplified to the read latch circuit 243.

Example 5

RCLK and nRCLK are Used

When the eMMC 300A performs read operations in the DDR400 mode, and bits 1 and 5 illustrated in FIG. 13 are set to "1", the processing circuit 212 deactivates the enable signals DEC, VEN, and VREF_ON based on the command CMD and the values stored in the extra I/O field illustrated in FIG. 13. And based on the command CMD and the values stored in the extra I/O field illustrated in FIG. 13, the data I/O control unit 337A deactivates the enable signals DIFF_EN and eVEN and activates the enable signals RCLK_EN, nRCLK_EN, and READ_EN. At this time, the processing circuit 212 generates the second selection signal HSE at the first level and the data I/O control unit 337A generates the third selection signal SE at either of the first and second levels.

The differential amplifier 322-3 communicates the return clock RCLK and the complementary return clock nRCLK to the host 200A. The second selection circuit 83 communicates the complementary return clock nRCLK to the negative input terminal of the differential amplifier 64 in response to the second selection signal HSE at the first level. The differential amplifier 64 amplifies a difference between the return clock RCLK input through the positive input terminal and the complementary return clock nRCLK input through the negative input terminal.

Example 6

RCLK, nCLK, and VREF are Used

When the eMMC 300A performs read operations in DDR400 mode, and bits 0, 2, 4, and 6 illustrated in FIG. 13 are set to "1", the processing circuit 212 activates the enable signals DEC, VEN, and VREF_ON based on the command CMD and the values stored in the extra I/O field illustrated in FIG. 13. And based on the command CMD and the values stored in the extra I/O field illustrated in FIG. 13, the data I/O control unit 337A deactivates the enable signal nRCLK_EN and activates the enable signals DIFF_EN, eVEN, RCLK_EN, and READ_EN. At this time, the processing circuit 212 generates the second selection signal HSE at the second level and the data I/O control unit 337A generates the third selection signal SE at either of the first and second levels.

When the complementary clock nCLK is input to the differential amplifier 71, the differential amplifier 71 amplifies a difference between the differential clocks CLK and nCLK and is thus robust to noise margin. At this time, the differential amplifier 71 operates at its highest speed.

However, when the reference voltage VREF is input to the differential amplifier 71, the differential amplifier 71 amplifies a difference between the clock CLK and the reference voltage VREF. The noise margin of the differential amplifier 71 at this time is less than that of the differential amplifier 71 when the differential clocks CLK and nCLK are used. However, when the reference voltage VREF can be adjusted, the timing or duty ratio of the clock CLK can also be adjusted. Accordingly, whether the data I/O control unit 337A generates the third selection signal SE at the first level or the third selection signal SE at the second level may be determined by a designer.

Example 7

RCLK, nRCLK, and VREF are Used

When the eMMC 300A performs read operations in DDR400 mode, and bits 1, 2, 5, and 6 illustrated in FIG. 13 are set to "1", the processing circuit 212 deactivates the host differential clock enable signal DEC and activates the enable signals VEN and VREF_ON based on the command CMD and the values stored in the extra I/O field illustrated in FIG. 13. And based on the command CMD and the values stored in the extra I/O field illustrated in FIG. 13, the data I/O control unit 337A deactivates the eMMC differential clock enable signal DIFF_EN and activates the enable signals eVEN, RCLK_EN, nRCLK_EN, and READ_EN. At this time, the processing circuit 212 generates the second selection signal HSE at the first level and the data I/O control unit 337A generates the third selection signal SE at either of the first and second levels.

Example 8

RCLK, nRCLK, and nCLK are Used

When the eMMC 300A performs read operations in DDR400 mode, and bits 0, 1, 4, and 5 illustrated in FIG. 13 are set to "1", the processing circuit 212 deactivates the enable signals VEN and VREF_ON and activates the host differential clock enable signal DEC based on the command CMD and the values stored in the extra I/O field illustrated in FIG. 13. And based on the command CMD and the values stored in the extra I/O field illustrated in FIG. 13, the data I/O control unit 337A deactivates the eMMC differential amplification enable signal eVEN and activates the enable signals DIFF_EN, RCLK_EN, nRCLK_EN, and READ_EN. At this time, the processing circuit 212 generates the second selection signal HSE at the first level and the data I/O control unit 337A generates the third selection signal SE at the first level.

Example 9

RCLK, nRCLK, nCLK, and VREF are Used

When the eMMC 300A performs read operations in DDR400 mode, and bits 0, 1, 2, 4, 5, and 6 illustrated in FIG. 13 are set to "1", the processing circuit 212 activates the enable signals DEC, VEN, and VREF_ON based on the command CMD and the values stored in the extra I/O field illustrated in FIG. 13. And based on the command CMD and the values stored in the extra I/O field illustrated in FIG. 13, the data I/O control unit 337A activates the enable signals DIFF_EN, eVEN, RCLK_EN, nRCLK_EN, and READ_EN. At this time, the processing circuit 212 generates the second selection signal HSE at either of the first and second levels and the data I/O control unit 337A generates the third selection signal SE at either of the first and second levels.

FIG. 15 is a block diagram of an eMMC system 100B according to another embodiment of the inventive concept. Referring to FIG. 15, the eMMC system 100B includes a host 200B and a device (eMMC) 300B.

The structure and the function of the eMMC system 100B illustrated in FIG. 15 are substantially the same as those of the eMMC system 100A illustrated in FIG. 1, except for a processing circuit 213 and the position of a reference voltage generator used to generate the reference voltage VREF. That is, while the host 200A is assumed to provide the reference voltage VREF to the eMMC 300A in the eMMC system 100A of FIG. 1, the host 200B is assumed to receive the reference voltage VREF from the eMMC 300B of the eMMC system 100B of FIG. 15.

Therefore, the functions of the processing circuit 213 illustrated in FIG. 15 are substantially the same as those of the processing circuit 212 illustrated in FIG. 1, with the exception that the processing circuit 213 of FIG. 15 need not provide the reference voltage enable signal VREF_ON.

FIG. 16 is a block diagram further illustrating portions of the eMMC system 100B of FIG. 15. Referring to FIGS. 15 and 16, a host I/O block 250B includes the differential clock generator 252, differential amplifiers, the second selection circuit 83, a receiver 65, and the host pads 21 through 26-2.

The receiver 65 receives the reference voltage VREF input through components 35, 105-1, and 25. The reference voltage VREF output from the eMMC 300B is provided to the host 200B through the reference voltage line 105-1.

The second selection circuit 83 outputs the signal nRCLK (or nRCLK having a DC level) received through the complementary return clock channel 104-1 or the reference voltage VREF received from the receiver 65 to the negative input terminal of the differential amplifier 64 in response to the second selection signal HSE.

The differential amplifier 64 amplifies a difference between the signal RCLK (or RCLK having a DC level) received through the return clock channel 104 and an output signal of the second selection circuit 83 or amplifies the signal RCLK (or RCLK having the DC level) received through the return clock channel 104 based on the host differential amplification enable signal VEN.

An eMMC I/O block 320B includes the eMMC pads 31 through 36-2, the third selection circuit 93, differential amplifiers, the part of the differential return clock generator 322-1, a driver 75, and a reference voltage generator 321.

Figure 17:
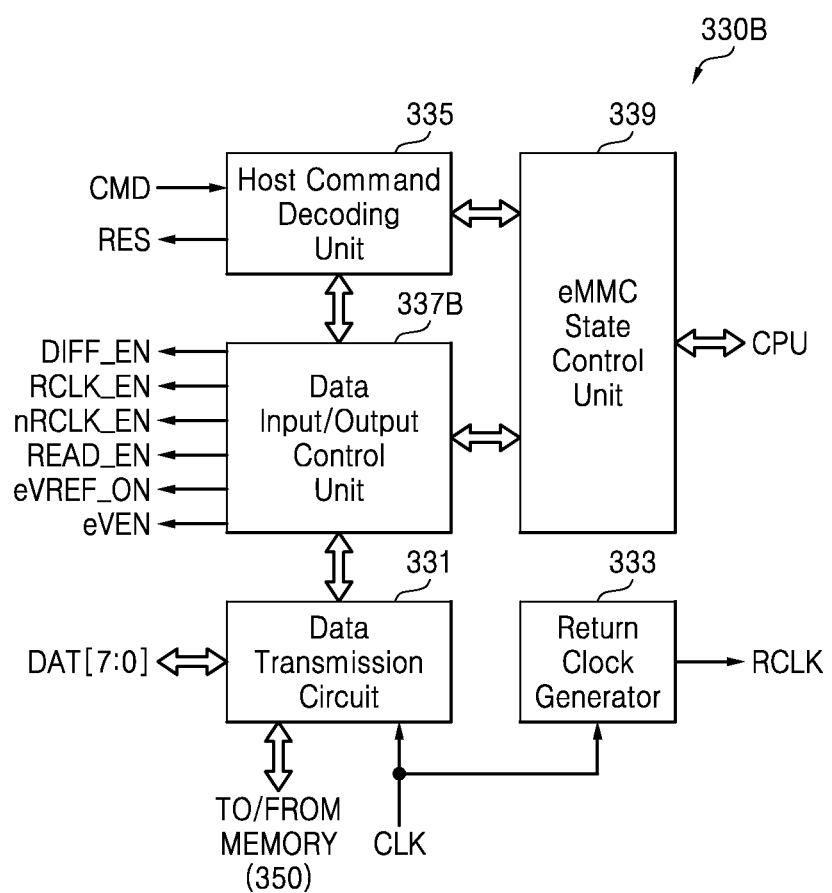
FIG. 17 is an internal block diagram of an eMMC host interface illustrated in FIG. 15.

The reference voltage generator 321 may generate the reference voltage VREF using the I/O operating voltages VCCQ and VSSQ provided from the host 200B in response to an eMMC reference voltage enable signal eVREF_ON output from a data I/O control unit 337B (FIG. 17).

In other words, the reference voltage generator 321 is enabled or disabled according to the activation or deactivation of the reference voltage enable signal eVREF_ON. The reference voltage generator 321 that has been disabled generates the reference voltage VREF having a DC level, e.g., the level of the ground voltage VSSQ.

The driver 75 drives the reference voltage VREF output from the reference voltage generator 321.

The operation of the eMMC 100B according to an operation mode of the eMMC system 100B illustrated in FIG. 15 and information, i.e., values set for bits 0 through 6 stored in the VENDOR_SPECIFIC_FIELD, e.g., the extra I/O field, of the EXT_CSD register 371 illustrated in FIG. 13 will be described below in the context of several operating mode examples.

Example 10 nCLK, RCLK, nRCLK, and VREF are not Used

When the eMMC 300B does not operate in DDR400, and bits 0 through 6 in FIG. 13 are set to "0", the processing circuit 213 deactivates the enable signals DEC VEN based on the command CMD and values stored in an extra I/O field illustrated in FIG. 13. At this time, the command CMD may be a write command or a read command. And based on the command CMD and the values stored in the extra I/O field illustrated in FIG. 13, the data I/O control unit 337B deactivates the enable signals DIFF_EN, eVEN, RCLK_EN, nRCLK_EN, READ_EN, and eVREF_ON. The reference voltage generator 321 that has been disabled generates the reference voltage VREF having the DC voltage, e.g., the level of the ground voltage VSSQ.

Or when the eMMC 300B performs write operations in DDR400 mode, the processing circuit 213 deactivates the enable signals DEC and VEN based on the command CMD and the values stored in the extra I/O field illustrated in FIG. 13. In addition, based on the command CMD, e.g., the data write command, and the values stored in the extra I/O field illustrated in FIG. 13, the data I/O control unit 337B deactivates the enable signals DIFF_EN, eVEN, RCLK_EN, nRCLK_EN, READ_EN, and eVREF_ON.

Example 11

Only RCLK is Used

When the eMMC 300B performs read operations in DDR400 mode, and bits 0 through 6 illustrated in FIG. 13 are set to "0", the processing circuit 213 deactivates the enable signals DEC and VEN based on the command CMD, e.g., the data write command, and the values stored in the extra I/O field illustrated in FIG. 13.

In addition, based on the command CMD and the values stored in the extra I/O field illustrated in FIG. 13, the data I/O control unit 337B deactivates the enable signals DIFF_EN, eVEN, nRCLK_EN, and eVREF_ON and activates the enable signals RCLK_EN and READ_EN. Accordingly, the return clock RCLK is provided to the host 200B through the return clock bus 104.

Example 12

RCLK and VREF are Used

When the eMMC 300B performs read operations in DDR400 mode, and bits 2 and 6 illustrated in FIG. 13 are set to "1", the processing circuit 213 deactivates the host differential clock enable signal DEC and activates the host differential amplification enable signal VEN based on the command CMD, e.g., the write command, and the values stored in the extra I/O field illustrated in FIG. 13.

In addition, based on the command CMD and the values stored in the extra I/O field illustrated in FIG. 13, the data I/O control unit 337B deactivates the enable signals DIFF_EN and nRCLK_EN and activates the enable signals eVEN, RCLK_EN, READ_EN, and eVREF_ON. At this time, the processing circuit 213 generates the second selection signal HSE at the second level and the data I/O control unit 337B generates the third selection signal SE at either of the first and second levels.

The reference voltage generator 321 generates the reference voltage VREF based on the I/O operating voltages VCCQ and VSSQ provided from the host 200B. The driver 75 communicates the reference voltage VREF output from the reference voltage generator 321 to the receiver 65 through the components 35, 105-1, and 25.

Example 13

RCLK and nCLK are Used

When the eMMC 300B performs read operations in DDR400 mode, and bits 0 and 4 illustrated in FIG. 13 are set to "1", the processing circuit 213 activates the host differential clock enable signal DEC and deactivates the host differential amplification enable signal VEN based on the command CMD and the values stored in the extra I/O field illustrated in FIG. 13.

In addition, based on the command CMD and the values stored in the extra I/O field illustrated in FIG. 13, the data I/O control unit 337B deactivates the enable signals eVEN, nRCLK_EN, and eVREF_ON and activates the enable signals DIFF_EN, RCLK_EN, and READ_EN.

Example 14

RCLK and nRCLK are Used

When the eMMC 300B performs read operation in DDR400 mode, and bits 1 and 5 illustrated in FIG. 13 are set to "1", the processing circuit 213 deactivates the enable signals DEC and VEN based on the command CMD and the values stored in the extra I/O field illustrated in FIG. 13.

In addition, based on the command CMD and the values stored in the extra I/O field illustrated in FIG. 13, the data I/O control unit 337B deactivates the enable signals DIFF_EN, eVEN, and eVREF_ON and activates the enable signals RCLK_EN, nRCLK_EN, and READ_EN. At this time, the processing circuit 213 generates the second selection signal HSE at the first level and the data I/O control unit 337B generates the third selection signal SE at either of the first and second levels.

Example 15

RCLK, nCLK, and VREF are Used

When the eMMC 300B performs the read operations in DDR400 mode, and bits 0, 2, 4, and 6 illustrated in FIG. 13 are set to "1", the processing circuit 213 activates the enable signals DEC and VEN based on the command CMD and the values stored in the extra I/O field illustrated in FIG. 13.

In addition, based on the command CMD and the values stored in the extra I/O field illustrated in FIG. 13, the data I/O control unit 337B deactivates the complementary return clock enable signal nRCLK_EN and activates the enable signals DIFF_EN, eVEN, RCLK_EN, READ_EN, and eVREF_ON. At this time, the processing circuit 213 generates the second selection signal HSE at the second level and the data I/O control unit 337B generates the third selection signal SE at either of the first and second levels.

Example 16

RCLK, nRCLK, and VREF are Used

When the eMMC 300B performs read operations in DDR400 mode, and bits 1, 2, 5, and 6 illustrated in FIG. 13 are set to "1", the processing circuit 213 deactivates the host differential clock enable signal DEC and activates the host differential amplification enable signal VEN based on the command CMD and the values stored in the extra I/O field illustrated in FIG. 13.

In addition, based on the command CMD and the values stored in the extra I/O field illustrated in FIG. 13, the data I/O control unit 337B deactivates the eMMC differential clock enable signal DIFF_EN and activates the enable signals eVEN, RCLK_EN, nRCLK_EN, READ_EN, and eVREF_ON. At this time, the processing circuit 213 generates the second selection signal HSE at either of the first and second levels and the data I/O control unit 337B generates the third selection signal SE at the second level.

Example 17

RCLK, nRCLK, and nCLK are Used

When the eMMC 300B performs read operations in DDR400 mode, and bits 0, 1, 4, and 5 illustrated in FIG. 13 are set to "1", the processing circuit 213 deactivates the host differential amplification enable signal VEN and activates the host differential clock enable signal DEC based on the command CMD and the values stored in the extra I/O field illustrated in FIG. 13.

In addition, based on the command CMD and the values stored in the extra I/O field illustrated in FIG. 13, the data I/O control unit 337B deactivates the enable signals eVEN and eVREF_ON and activates the enable signals DIFF_EN, RCLK_EN, nRCLK_EN, and READ_EN. At this time, the processing circuit 213 generates the second selection signal HSE at the first level and the data I/O control unit 337B generates the third selection signal SE at the first level.

Example 18

RCLK, nRCLK, nCLK, and VREF are Used

When the eMMC 300B performs read operations in DDR400 mode, and bits 0, 1, 2, 4, 5, and 6 illustrated in FIG. 13 are set to "1", the processing circuit 213 activates the enable signals DEC and VEN based on the command CMD and the values stored in the extra I/O field illustrated in FIG. 13.

In addition, based on the command CMD and the values stored in the extra I/O field illustrated in FIG. 13, the data I/O control unit 337B activates the enable signals DIFF_EN, eVEN, RCLK_EN, nRCLK_EN, READ_EN, and eVREF_ON. At this time, the processing circuit 213 generates the second selection signal HSE at either of the first and second levels and the data I/O control unit 337B generates the third selection signal SE at either of the first and second levels.

FIG. 17 is a block diagram further illustrating the host interface 330B of FIG. 15. The structure and the functions of the data I/O control unit 337B illustrated in FIG. 17 are substantially the same as those of the data I/O control unit 337A illustrated in FIG. 3, except for the operations of the data I/O control unit 337B.

The data I/O control unit 337B may be used to control the activation/deactivation of each of the enable signals DIFF_EN, RCLK_EN, nRCLK_EN, READ_EN, eVREF_ON, and eVEN according to the operation of the host command decoding unit 335, the operation of the eMMC state control unit 339, and/or the values stored in the extra I/O field illustrated in FIG. 13.

Figure 18A:
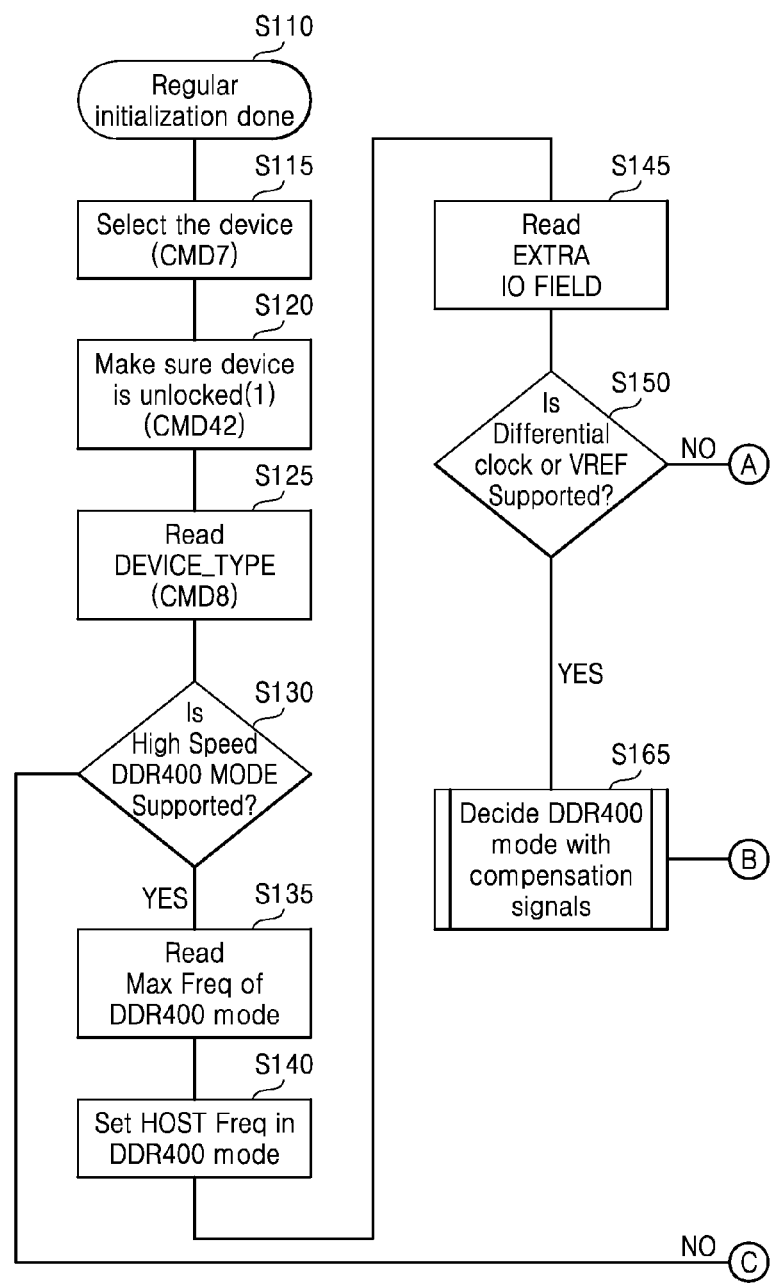
FIGS. 18A and 18B are flowcharts of the operations of the eMMC system illustrated in FIG. 1 or 15.
Figure 18B:
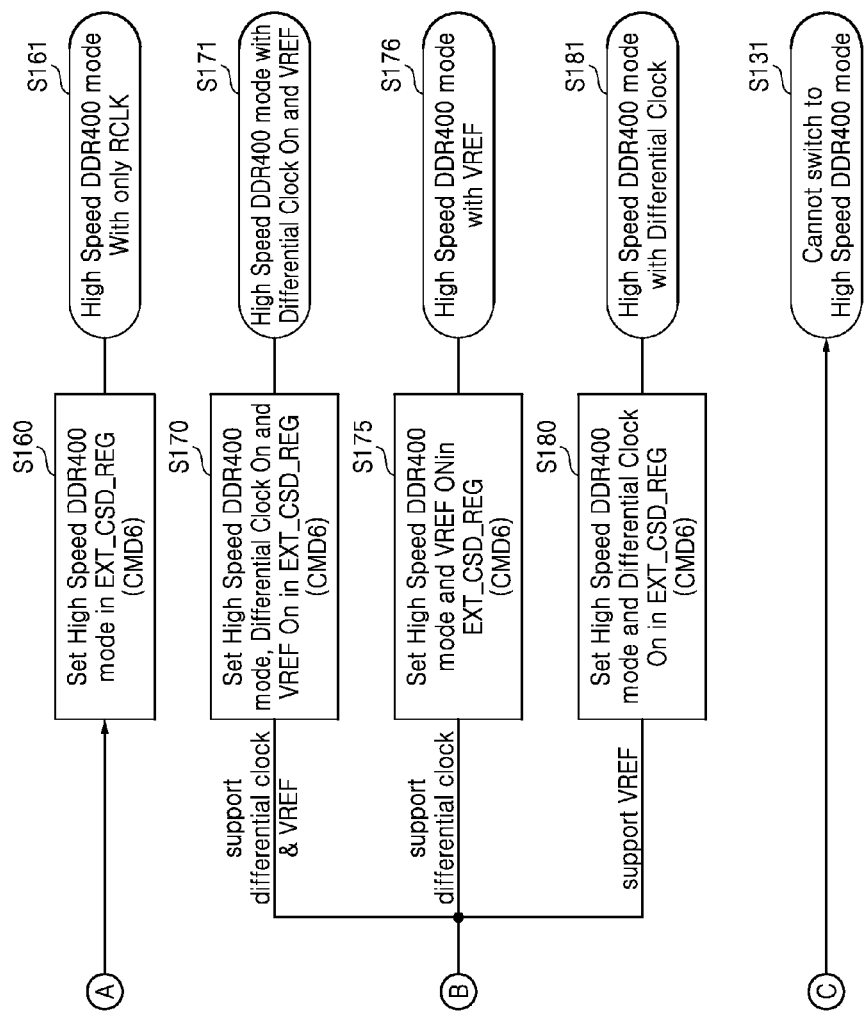

FIGS. 18A and 18B are related flowchart portions summarizing one possible method of operating the eMMC system 100A described in relation to FIGS. 1, 2 and 3, or the eMMC system 100B described in relation to FIGS. 15, 16 and 17. Referring to these figures, "a host 200" being either of hosts 200A and 200B determines that a regular initialization of "an eMMC 300" being either of eMMCs 300A and 300B has been completed (S110). The host 200 then selects the eMMC device 300 using CMD7 (S115).

The host 200 than determines that the eMMC 300 has been unlocked using CMD42 (S120). Competent examples of operations S110, S115 and S120 for "an eMMC system 100" being either eMMC system 100A or eMMC system 100B are describe in FESD84-B451 referenced above. Using these conventionally understood steps, the host 200 may ascertain that the eMMC 300 is ready to operate. Now, the host 200 may determine the operating mode for the eMMC 300.

This process may begin with the host 200 reading the DEVICE_TYPE[196] field indicated in the EXT_CSD register 371 of the eMMC 300 to determine whether the eMMC 300 supports DDR400 mode. To do this, in certain embodiments of the inventive concept, the host 200 issues a SEND_EXT_CSD command (CMD8) that results in the return of eMMC data stored in (i.e., data corresponding to the eMMC information) of the EXT_CSD register 371 (S125). Based on the returned eMMC data (e.g., bit 6 or bit 7 stored in the DEVICE_TYPE[196] of the EXT_CSD register 371 as illustrated in FIG. 5), the host 200 may determine whether the eMMC 300 supports high speed DDR400 mode (S130).

When the eMMC 300 does not support the high speed DDR400 mode, or will perform a write operation in DDR400 mode (S130=NO), the eMMC 300 will not switch to the high speed DDR400 mode as described in Examples 1 and 10 above (S131).

However, when the eMMC 300 supports the high speed DDR400 mode (S130=YES), the host 200 reads a maximum frequency for the clock CLK in the DDR400 mode as part of the eMMC information which is stored, for example, in the VENDOR_SPECIFIC_FIELD of the EXT_CSD register 371 (S135). The eMMC information specifying the maximum frequency for the clock CLK in DDR400 mode is illustrated in one example by the table shown in FIG. 12.

In response to the eMMC information specifying a maximum clock CLK frequency, the host 200 may change (or "set") the frequency of the clock CLK accordingly (S140). For example, a maximum frequency control signal (Fmax) may be derived from the eMMC information regarding the maximum frequency of the clock CLK.

Thereafter, the host 200 may read eMMC information stored in the extra I/O field related to the DDR400 mode which may be stored, for example, in the VENDOR_SPECIFIC_FIELD of the EXT_CSD register 371 (S145).

The host 200 may then determine whether the eMMC 300 supports the use of differential clocks CLK and nCLK and/or RCLK and nRCLK, or supports the use of the reference voltage VREF (S150). These determinations may be made, for example, based on the value of bits 0, 1 and 2 in the extra I/O field illustrated in FIG. 13.

When all of the bits 0, 1 and 2 in the extra I/O field are set to "0" (S150=NO), the host 200 sets each of bits 4, 5 and 6 to "0" in the extra I/O field of the EXT_CSD register (EXT_CSD_REG) 371 using the SWITCH command (CMD6) (S160). As a result, the eMMC 300 will operate in a version of the high speed DDR400 mode that supports only the return clock RCLK as described above in relation to Example 2 and 11 (S161).

However, when at least one of the bits 0, 1 and 2 in the extra I/O field is set to "1", the host 200 must further determine which particular version of the DDR400 mode supporting at least one of the compensation signals nCLK, nRCLK, and VREF should be used (S165).

Consistent with the operating mode examples described above, when bits 0 and 2, 1 and 2, or 0, 1 and 2 in the extra I/O field are set to "1", the host 200 may correspondingly sets bits 4 and 6, 5 and 6, or 4, 5 and 6 in the extra I/O field of the EXT_CSD_REG 371 to "1" using one or more SWITCH command(s) (CMD6) (S170, S175 or S180).

Accordingly, the eMMC 300 may operate according to one of multiple versions of the high speed DDR400 mode, each operating mode supporting the use of at least one "complementary clocks" (e.g., nCLK and nRCLK0) and/or the use of a reference voltage VREF (S171, S176 or S181). See, the operating mode examples 6, 7, 9, 15, 16, and 18 described above.

For example, When bit 2 in the extra I/O field is set to "1", the host 200 sets bit 6 in the extra I/O field of the EXT_CSD_REG 371 using the SWITCH command (CMD6) (S175). Accordingly, the eMMC 300 will operate in the high speed DDR400 mode while supporting use of the reference voltage VREF and the return clock RCLK (S176) See, operating mode examples 3 and 12.

When at least one of bit 0 and bit 1 in the extra I/O field is set to "1", the host 200 sets at least one of bit 4 and bit 5 in the extra I/O field of the EXT_CSD_REG 371 to "1" using the SWITCH command (CMD6) (S180). Accordingly, the eMMC 300 will operate in the high speed DDR400 mode while supporting at least one complementary clocks nCLK and nRCLK and the return clock RCLK (S181). See, operating mode examples 4, 5, 8, 13, 14, and 17.

According to certain embodiments of the inventive concept, an eMMC in an eMMC system performing a read operation or a write operation may appropriately define the signal type (e.g., toggled or DC) and level for one or more "additional signals" (e.g., nCLK, RCLK, nRCLK, and VREF) that are communicated between a host and the eMMC in the eMMC system, beyond the data, command and clock signals communicated by conventional eMMC systems. Certain DC signal levels may be the same as an I/O operating voltage (e.g., VCCQ) or ground voltage (VSSQ). The provision of these additional signals improves data transfer efficiency and accuracy in the eMMC system.

In this regard, the eMMC may use certain data I/O control units to activate/deactivate corresponding enable signals (e.g., eVEN, RCLK_EN, nRCLK_EN, READ_EN, and eVREF_ON) in response to one or more command(s) CMD and/or the data value(s) for eMMC data stored in the EXT_CSD register. Similarly, the processing circuit of the host may be used to activate/deactivate certain enable signals (e.g., DEC, VEN, and VREF_ON) in response to a particular response from the eMMC and/or the data value(s) for eMMC data stored in the EXT_CSD register.

Thus, an eMMC system and a constituent eMMC may have, according to certain embodiments of the inventive concept, structure(s) and operating mode(s) that are different from those described by conventional standards. Such eMMC systems and constituent eMMCs according to embodiments of the inventive concept are able to operate in the 200 MHz DDR mode. Yet, provision of at least a return clock synchronized with read data signals provided to a host during a read operations maximizes the data valid window for the read data. That is, according to certain embodiments of the inventive concept, a host controlling the eMMC may use a return clock generated based on a clock as a strobe signal during a read/write operations performed in the 200 MHz DDR mode to thereby reliably store or latch read/write data in relation to the return clock.

In addition, eMMC systems and constituent eMMCs may use differential clocks, thereby eliminating or reducing the influence of noise occurring due to the clock. Hosts in such eMMC systems may also use differential return clocks, thereby eliminating or reducing the influence of noise occurring due to the return clock.

The eMMC and/or host may use a reference voltage generated based on I/O operating voltages, thereby eliminating or reducing the influence of noise occurring due to the I/O operating voltages.

While the inventive concept has been particularly shown and described with reference to exemplary embodiments thereof, it will be understood by those of ordinary skill in the art that various changes in forms and details may be made therein without departing from the scope of the inventive concept as defined by the following claims.

What is claimed is:
1. An embedded multimedia card (eMMC) comprising:
a clock channel that receives a clock from a host;
a complementary clock channel that receives a complementary clock from the host;
a command/response channel that receives a command from the host and communicates a response to the host;
a plurality of data channels that receives data from the host and communicates data to the host;
a return clock channel that communicates a return clock to the host synchronously with communication of the data to the host;
a complementary return clock channel that communicates a complementary return clock to the host;
a reference voltage channel that either receives a reference voltage from the host, or communicates a reference voltage to the host; and
an extended card specific data (CSD) register ("EXT_CSD register") configured to store at least one of:
eMMC information indicating whether the eMMC supports a 200 MH dual data rate (DDR) mode in a DEVICE_TYPE[196] field of the EXT_CSD register,
eMMC information defining interface timing for the return clock in a HS_TIMING[185] field of the EXT_CSD register,
eMMC information defining a maximum frequency for the clock in a VENDOR_SPECIFIC_FIELD of the EXT_CSD register, and
eMMC information indicating whether at least one of the complementary clock, complementary return clock, and reference voltage is supported by the eMMC in the VENDOR_SPECIFIC_FIELD of the EXT_CSD register.

2. The eMMC of claim 1, wherein during a write operation, the data is write data communicated from the host to the eMMC via the plurality of data channels, and
each one of the return clock and the complementary return clock have a direct current (DC) level.

3. The eMMC of claim 1, wherein during a read operation, the data is read data communicated from the eMMC to the host via the plurality of data channels, and
at least one of the return clock and the complementary return clock toggles.

4. The eMMC of claim 1, further comprising:
a selection circuit that provides as an output signal one of the complementary clock channel and the reference voltage in response to a selection signal;
a differential amplifier that receives the clock and the output signal of the selection circuit; and
a differential return clock generator that generates at least one of the return clock and the complementary return clock in response to an output signal of the differential amplifier.

5. The eMMC of claim 4, wherein the differential amplifier amplifies one of a difference between the clock and the output signal of the selection circuit and the clock based on a differential clock enable signal.

6. The eMMC of claim 3, wherein the differential return clock generator communicates the return clock having a DC level via the return clock channel and communicates the complementary return clock having the DC level via the complementary return clock channel in response to a read enable signal.

7. The eMMC of claim 3, wherein the differential return clock generator communicates at least one of the return clock and the complementary return clock to at least one of the return clock channel and the complementary return clock channel in response to a read enable signal and a transmission enable signal.

8. The eMMC of claim 1, further comprising:
a reference voltage generator that generates the reference voltage based on an input/output (I/O) operating voltage received from the host.

9. The eMMC of claim 1, wherein a rising edge and a falling edge of data signals communicating data to the host from the plurality of channel are respectively synchronous with a rising edge and a falling edge of the return clock.

10. A host that controls an embedded multimedia card (eMMC) in an eMMC system, the host being connected with:
a clock channel that communicates a clock to the eMMC;
a complementary clock channel that communicates a complementary clock to the eMMC;
a command/response channel that communicates a command to the eMMC and receives a response from the eMMC;
a plurality of data channels that communicate data to the eMMC and receive data from the eMMC;
a return clock channel that receive a return clock synchronous with the data received from the eMMC;
a complementary return clock channel that receives a complementary return clock from the eMMC; and
a reference voltage channel that either communicates a reference voltage to the eMMC or receives the reference voltage from the eMMC,
wherein the host comprises a host controller configured to issue a command obtaining eMMC information stored in an extended card specific data (CSD) register ("EXT_CSD register") disposed on the eMMC, and
the information stored on the EXT_CSD register includes at least one of:

eMMC information indicating whether the eMMC supports a 200 MH dual data rate (DDR) mode in a DEVICE_TYPE[196] field of the EXT_CSD register,
eMMC information defining interface timing for the return clock in a HS_TIMING[185] field of the EXT_CSD register,
eMMC information defining a maximum frequency for the clock in a VENDOR_SPECIFIC_FIELD of the EXT_CSD register, and
eMMC information indicating whether at least one of the complementary clock, complementary return clock, and reference voltage is supported by the eMMC in the VENDOR_SPECIFIC_FIELD of the EXT_CSD register.

11. The host of claim 10, wherein during a write operation, the data is write data communicated from the host to the eMMC via the plurality of data channels, and each one of the return clock and the complementary return clock have a direct current (DC) level.

12. The host of claim 10, wherein during a read operation, the data is read data communicated from the eMMC to the host via the plurality of data channels, and at least one of the return clock and the complementary return clock toggles.

13. The host of claim 10, further comprising:
a reference voltage generator that generates the reference voltage.

14. A method of operating an embedded multimedia card (eMMC) system including a host and an eMMC, the method comprising:
during a read operation performed by the eMMC system,
communicating a clock and a complementary clock from the host to the eMMC;
generating a return clock and a complementary return clock from the clock and the complementary clock in the eMMC; and
communicating at least one of the return clock and the complementary return clock to the host from the eMMC synchronously with read data communicated to the host from the eMMC,
wherein generating the return clock and the complementary return clock comprises;
providing as an output signal one of the complementary clock channel and a reference voltage in response to a selection signal,
generating the return clock using a differential signal between the clock and the output signal, and
generating the complementary return clock from the return clock.

15. The method of claim 14, further comprising:
generating a reference voltage in the host; and
communicating the reference voltage from the host to the eMMC via a dedicated reference voltage line.

16. The method of claim 14, further comprising:
generating a reference voltage in the eMMC; and
communicating the reference voltage from the eMMC to the host via a dedicated reference voltage line.

17. The method of claim 15, further comprising:
during the read operation, amplifying read data in the eMMC using the reference voltage to generate amplified read data; and
communicating the amplified read data to the host.

18. The method of claim 14, further comprising:
during a write operation, communicating the clock to the eMMC via a dedicated clock line; and
during the read operation, communicating the clock to the eMMC via the dedicated clock line and also communicating a complementary clock to the eMMC via a dedicated complementary clock line.

* * * * *